US 6,674,623 B1

United States Patent
Abe et al.

(10) Patent No.: US 6,674,623 B1
(45) Date of Patent: Jan. 6, 2004

(54) MICROCOMPUTER EQUIPPED WITH BUILT-IN TEMPERATURE SENSOR

(75) Inventors: Toshihiro Abe, Tokyo (JP); Shintaro Mori, Tokyo (JP); Fumihiko Terayama, Tokyo (JP); Masahiro Kitamura, Tokyo (JP); Seiichi Yamazaki, Tokyo (JP); Yasuo Moriguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/577,134

(22) Filed: May 24, 2000

(30) Foreign Application Priority Data

Dec. 2, 1999 (JP) ............................................ 11-343826

(51) Int. Cl.[7] ................................................ H02H 5/00
(52) U.S. Cl. ......................................... 361/103; 361/58
(58) Field of Search ............................ 361/18, 58, 103, 361/104, 105, 106, 115, 93.1

(56) References Cited

U.S. PATENT DOCUMENTS 5,829,879 A * 11/1998 Sanchez et al. ............. 374/178
6,332,710 B1 * 12/2001 Aslan et al. ................. 374/183

FOREIGN PATENT DOCUMENTS

JP        7-326714      12/1995        H01L/27/04

* cited by examiner

Primary Examiner—Stephen W. Jackson
(74) Attorney, Agent, or Firm—Burns, Doane, Swecker & Mathis, LLP

(57) ABSTRACT

In a microcomputer equipped with a built-in temperature sensor, diodes as a temperature sensor are incorporated in a pair of circuit blocks, respectively, and placed in opposite polarity connection to each other. When detecting a temperature of the microcomputer, a constant current If is supplied to the diodes through terminals commonly connected to both the diodes. A voltage Vf generated at each diode is read through terminals located at more adjacent nodes to the diode when compared in position with the terminals.

13 Claims, 23 Drawing Sheets

MICROCOMPUTER EQUIPPED WITH BUILT-IN TEMPERATURE SENSOR

BACKGROUND OF THE INVENTION

1. Field of the Invention

The present invention relates to a microcomputer equipped with a built-in temperature sensor, which is capable of avoiding the occurrence of faulty operation and runaway of the microcomputer mounted on a semiconductor chip, even if the temperature of the semiconductor chip rises under the fluctuation of various conditions of circumstance during the operation of the microcomputer.

2. Description of the Related Art

In general, the entire electrical characteristic of a microcomputer is greatly changed under the fluctuation of the values of conductance and resistances of transistors incorporated in the microcomputer. This fluctuation is caused by the change of various conditions of circumstance, such as the operation temperature and the like, during the operation of the microcomputer.

When the temperature of the microcomputer rises during operation, the electrical characteristic thereof is shifted to a small operation margin. When the electrical characteristic is reached to and over the boundary of the operation margin, the runaway of the microcomputer occurs.

In order to avoid the occurrence of the runaway of the microcomputer, it must be necessary to compensate the operation of the microcomputer under the fluctuation of various conditions of circumstance during operation. In order to achieve this requirement, a simulation is performed in the design of the microcomputer under a temperature range. This temperature range is predicted under the various conditions of circumstance during operation.

However, it is difficult to get the optimum temperature range in the conditions of circumstance as actual operation under the state in which the microcomputer is incorporated in actual commercial products. Further, there is a drawback where different regions in the same semiconductor chip on which the microcomputer is mounted have difference temperatures.

Because the conventional microcomputer has the above configuration and the drawbacks, the simulation is executed under a wider and waste temperature range. However, in use of the microcomputer, there happens a case where the temperature of the microcomputer during operation becomes over the temperature range that has been predicted in the design. As a result, the runaway of the microcomputer occurs, so that the faulty operation of the microcomputer also happens.

SUMMARY OF THE INVENTION

Accordingly, an object of the present invention is, with due consideration to the drawbacks of the conventional technique, to provide a microcomputer equipped with a built-in temperature sensor, which is mounted on a semiconductor chip, capable of avoiding the occurrence of faulty operation and runaway, even if the temperature of the semiconductor chip rises over a prescribed value by fluctuation of various conditions of circumstance during the operation of the microcomputer. The temperature sensor or both the temperature sensor and a voltage break circuit are incorporated in the microcomputer the voltage break circuit is operable under a predetermined temperature range. The temperature sensor is capable of detecting an inner temperature of the semiconductor chip in order to set the optimum operation conditions of the microcomputer.

In accordance with a preferred embodiment of the present invention, a microcomputer equipped with a built-in temperature sensor has diodes incorporated in a pair of circuit blocks, the diodes being placed in opposite polarity connection to each other, a first terminal group connected commonly to the each diode, through which a constant current is supplied, and a second terminal group through which a voltage generated at each diode is read, and connected commonly to and placed at more adjacent nodes to the each diode when compared with the first terminal group. Thereby, optimum operation conditions of the microcomputer can be set according to the change of the temperature of the microcomputer.

In accordance with another preferred embodiment of the present invention, a microcomputer equipped with a built-in temperature sensor has a diode incorporated in each of a plurality of circuit blocks, a first terminal group connected commonly to the each of the plurality of diodes, through which a constant current is supplied, a second terminal group through which a voltage generated at each of the plurality of diodes is read, and connected commonly to and placed at more adjacent nodes to the each of the plurality of diodes when compared with the first terminal group, a selection switch for selecting one of the plurality of diodes, and a selection register in which a prescribed value to control operation of the selection switch is stored. Thereby, optimum operation conditions of the microcomputer can be set according to the change of the temperature of the microcomputer.

In the microcomputer equipped with a built-in temperature sensor described above, the plurality of circuit blocks are divided into plural pairs, each pair consists of two circuit blocks. The diodes incorporated in each pair are placed in opposite polarity connection to each other, and the selection switch selects one pair of the two circuit blocks in the plurality of circuit blocks according to the prescribed value stored in the selection register. Thereby, optimum operation conditions of the microcomputer can be set according to change of the temperature of the semiconductor chip.

In accordance with another preferred embodiment of the present invention, a microcomputer equipped with a built-in temperature sensor has a temperature sensor circuit having a diode and a first resistance connected in series between a first power source voltage and a second power voltage source, a MOS inverter circuit, and a terminal connected to a second node through which the second resistance and the first MOS transistor are connected. The MOS inverter circuit has a first MOS transistor whose gate is connected to a node through which the diode and the first resistance being connected, and a second resistance connected to the first MOS transistor in series. In the microcomputer, the second resistance is connected to the first power source voltage, and the first MOS transistor is connected to the second power source voltage, and the temperature sensor circuit and the MOS inverter circuit forms a voltage break circuit.

In the microcomputer equipped with a built-in temperature sensor described above, a plurality of the MOS inverter circuits are placed in parallel. Each MOS inverter circuit has the first MOS transistor and the second resistance. Threshold values of the first MOS transistors in the plurality of MOS inverter circuits are set stepwise. The gates of the first MOS transistors are commonly connected to the first node, and each of the second nodes of the plurality of MOS inverter circuits is connected to, instead of the terminal, a corresponding register in which a value corresponding to a voltage potential at each second node.

The microcomputer equipped with a built-in temperature sensor, as another preferred embodiment of the present invention, further has a selection switch for selecting one of the plurality of MOS inverter circuits in order to connect the selected MOS inverter to the temperature sensor circuit and the terminal through the first node and the second node, and a selection register for storing a prescribed value by which an operation of the selection switch is controlled.

In accordance with another preferred embodiment of the present invention, a microcomputer equipped with a built-in temperature sensor has a temperature monitor circuit for generating and outputting a control signal when a temperature of a semiconductor chip on which the microcomputer is mounted rises over a prescribed value, an interrupt circuit for inputting the control signal output from the interrupt circuit to initiate an interrupt operation, a CPU core for halting temporarily generation of a clock signal according to an instruction output from the interrupt circuit, and a timer circuit. The timer circuit initiates a counting operation according to the instruction to initiate the interrupt operation which is output from the interrupt circuit, and generates an instruction to restart the generation of the clock signal to the CPU core after a counted number obtained by the counting operation reaches to a predetermined number.

In the microcomputer equipped with a built-in temperature sensor, as another preferred embodiment of the present invention, the temperature monitor circuit has a temperature sensor circuit having a diode and a first resistance connected in series between a first power source voltage and a second power voltage source, a plurality of MOS inverter circuits, a NOR circuit connected to each second node through which the first MOS transistor and the second resistance in each of the plurality of MOS inverter circuits are connected, and a temperature selection register for storing prescribed values to be used for controlling ON/OFF operation of each second MOS transistor. The temperature selection register is connected to a gate of the second MOS transistor in each of the plurality of MOS inverter circuits. The NOR circuit performs a NOR operation between values of the second nodes. Each MOS inverter circuit has a first MOS transistor whose gate is connected to a first node through which the diode and the first resistance are connected, and a second resistance and a second MOS transistor which are connected in series and placed to the first MOS transistor.

In the microcomputer equipped with a built-in temperature sensor described above, as another preferred embodiment, the temperature monitor circuit has a temperature sensor circuit (which has a diode and a first resistance connected in series between a first power source voltage and a second power voltage source), an A/D converter for converting an analogue voltage value at a first node between the diode and the first resistance to a digital voltage value, a temperature monitor register for storing the digital voltage value output from the A/D converter, a prescribed value register for storing a prescribed value, and a comparator for comparing the digital voltage value in the temperature monitor register with the prescribed value stored in the prescribed value, and for outputting a comparison result as a control signal.

The microcomputer equipped with a built-in temperature sensor described above, as another preferred embodiment, further has a plurality of the temperature monitor circuits, and a NOR circuit for inputting control signals which are output from the plurality of the temperature monitor circuits, for performing a NOR operation among the control signals, and for outputting a result of the NOR operation to the interrupt circuit.

In accordance with another preferred embodiment of the present invention, a microcomputer equipped with a built-in temperature sensor has a temperature monitor circuit, a CPU core, an interrupt circuit, and a timer circuit. The temperature monitor circuit generates and outputs a control signal when a temperature of a semiconductor chip on which the microcomputer is mounted rises over a prescribed value. The CPU core has a control register, inputs the control signal from the temperature sensor circuit and storing the control signal. The interrupt circuit initiates an interrupt operation to halt a generation operation of a clock signal executed by the CPU core according to the control signal stored in the control register. The timer circuit initiates a counting operation according to the control signal stored in the control register, and generates an instruction to restart the generation operation of the clock signal to the CPU core after a counted number obtained by the counting operation reaches to a predetermined number.

The microcomputer equipped with a built-in temperature sensor described above, as another preferred embodiment, further has a plurality of the temperature monitor circuits, and a NOR circuit. The NOR circuit inputs control signals which are output from the plurality of the temperature monitor circuits, performs a NOR operation among the control signals, and outputs a result of the NOR operation to the CPU core.

In the microcomputer equipped with a built-in temperature sensor described above, as another preferred embodiment, the temperature monitor circuit has a temperature sensor circuit, a NOR circuit, and a temperature selection register. The temperature sensor circuit has a diode and a first resistance connected in series between a first power source voltage and a second power voltage source, a plurality of MOS inverter circuits. Each MOS inverter circuit has a first MOS transistor whose gate is connected to a first node through which the diode and the first resistance are connected, and a second resistance and a second MOS transistor which are connected in series and placed to the first MOS transistor. The NOR circuit is connected to each second node through which the first MOS transistor and the second resistance in each of the plurality of MOS inverter circuits are connected. The NOR circuit performs a NOR operation between values of the second nodes. The temperature selection register is connected to a gate of the second MOS transistor in each of the plurality of MOS inverter circuits. The temperature selection register stores prescribed values to be used for controlling ON/OFF operation of each second MOS transistor.

In the microcomputer equipped with a built-in temperature sensor described above, as another preferred embodiment, the temperature monitor circuit has a temperature sensor circuit, an A/D converter, a temperature monitor register, a prescribed value register, and a comparator. The temperature sensor circuit has a diode and a first resistance connected in series between a first power source voltage and a second power voltage source. The A/D converter converts an analogue voltage value at a node between the diode and the first resistance to a digital voltage value. The temperature monitor register stores the digital voltage value output from the A/D converter. The prescribed value register stores a prescribed value. The comparator compares the digital voltage value in the temperature monitor register and the prescribed value stored in the prescribed value, and outputs a comparison result as a control signal.

The microcomputer equipped with a built-in temperature sensor described above, as another preferred embodiment, further has a plurality of the temperature monitor circuits, and a NOR circuit for inputting control signals which are output from the plurality of the temperature monitor circuits, for performing a NOR operation among the control signals, and for outputting a result of the NOR operation to the control register in the CPU core. In the microcomputer, the interrupt circuit outputs an instruction to initiate the interrupt operation to the CPU core according to a value of the control signal which is stored in the control register, and for outputting an instruction to initiate the counting operation to the timer circuit simultaneously.

In accordance with another preferred embodiment of the present invention, a microcomputer equipped with a built-in temperature sensor has a voltage break circuit and a power source voltage generation circuit. The voltage break circuit has a temperature sensor circuit placed in a circuit block (which has a diode and a first resistance connected in series to a first power source voltage and a second power source voltage), a first MOS transistor whose gate is connected to a first node through which the diode and the first resistance are connected, and a second resistance connected in series to the first MOS transistor. In the voltage break circuit, the second resistance is connected to the first power source voltage, and the first MOS transistor is connected to the second power source voltage. The power source voltage generation circuit in which a selector is incorporated, the selector inputs a control voltage signal output from the voltage break circuit, and selects one of a first voltage and a second voltage based on a level of the control voltage signal, and outputs the voltage.

The microcomputer equipped with a built-in temperature sensor described above, as another preferred embodiment, further has a plurality of the MOS inverter circuits, a selection switch, and a selection register. The plurality of the MOS inverter circuits are placed in parallel, each MOS inverter circuit has the first MOS transistor and the second resistance, and threshold values of the first MOS transistors in the plurality of MOS inverter circuits are set stepwise. The selection switch selects one of the plurality of MOS inverter circuits and connects the selected one to the temperature sensor circuit and the power source voltage generation circuit. The selection register stores a prescribed value by which operation of the selection switch is controlled.

In accordance with another preferred embodiment of the present invention, a microcomputer equipped with a built-in temperature sensor has a temperature sensor circuit, an A/D converter, a temperature monitor register, a prescribed value register, a comparator, and a power source voltage generation circuit. The temperature sensor circuit has a diode and a first resistance connected in series between a first power source voltage and a second power voltage source. The A/D converter converts an analogue voltage value at a first node through which the diode and the first resistance to a digital voltage value. The temperature monitor register stores the digital voltage value output from the A/D converter. The prescribed value register stores a prescribed value. The comparator compares the digital voltage value in the temperature monitor register and the prescribed value stored in the prescribed value register, and outputs a comparison result. The power source voltage generation circuit has a selector. The selector selects one of a first voltage and a second voltage based on a level of the comparison result, and outputs the selected voltage.

The microcomputer equipped with a built-in temperature sensor described above, as another preferred embodiment, further has a plurality of the prescribed value registers for storing a plurality of prescribed values, and a plurality of the comparators corresponding to the plurality of prescribed value registers. In the microcomputer, each of the plurality of comparators inputs an output from the temperature monitor register and the prescribed value from the corresponding prescribed value register.

In accordance with another preferred embodiment of the present invention, a microcomputer equipped with a built-in temperature sensor has a voltage break circuit, and a wait control circuit. The voltage break circuit has a temperature sensor circuit incorporated in a circuit block (having a diode and a first resistance connected in series to a first-power source voltage and a second power source voltage), a MOS transistor whose gate is connected to a first node through which the diode and the first resistance are connected, and a second resistance connected in series to the MOS transistor. In the voltage break circuit, the second resistance is connected to the first power source voltage, and the MOS transistor is connected to the second power source voltage. The wait control circuit having a selector. The selector inputs a control voltage signal output from the voltage break circuit, and selects one of a first clock signal of a first cycle and a second clock signal of a second cycle based on a level of the control voltage signal, and outputs the selected clock signal in order to adjust an accessing time by which an external device is accessed correctly.

In the microcomputer equipped with a built-in temperature sensor described above, as another preferred embodiment, a circuit is incorporated instead of the voltage break circuit, the circuit has a temperature sensor circuit comprises a diode and a first resistance connected in series between a first power source voltage and a second power voltage source, an A/D converter for converting an analogue voltage value at a first node through which the diode and the first resistance to a digital voltage value, a temperature monitor register for storing the digital voltage value output from the A/D converter, a prescribed value register for storing a prescribed value, and a comparator for comparing the digital voltage value in the temperature monitor register and the prescribed value stored in the prescribed value register, and for outputting a comparison result. In the microcomputer, the selector incorporated in the wait control circuit selects one of the first clock signal of a first bus cycle and the second clock signal of a second bus cycle based on the comparison result from the comparator.

In the microcomputer equipped with a built-in temperature sensor described above, as another preferred embodiment, a first output buffer, a second output buffer, and a switch are incorporated instead of the wait control circuit. In the microcomputer, the switch inputs the control voltage signal output from the voltage break circuit, and selects one of or both the first output buffer and the second output buffer based on a level of the control voltage signal.

In the microcomputer equipped with a built-in temperature sensor described above, as another preferred embodiment, a first output buffer, a second output buffer, and a switch are incorporated instead of the wait control circuit. In the microcomputer, the switch inputs the comparison result output from the comparator, and selects one of or both the first output buffer and the second output buffer based on a level of the comparison result.

In the microcomputer equipped with a built-in temperature sensor described above, as another preferred embodiment, a high temperature mode bit circuit is incorporated instead of the wait control circuit. The high temperature mode bit circuit inputs the control voltage signal output from the voltage break circuit, and switches operation modes of the microcomputer, a high temperature operation mode and a normal operation mode, according to a level of the control voltage signal.

In the microcomputer equipped with a built-in temperature sensor described above, as another preferred embodiment, a high temperature mode bit circuit is incorporated instead of the wait control circuit. This high temperature mode bit circuit inputs the comparison result output from the comparator, and switches operation modes of the microcomputer, a high temperature operation mode and a normal operation mode, according to a level of the comparison result.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments that are given for illustration of the invention and are not intended to be limiting thereof.

First Embodiment

Figure 1:
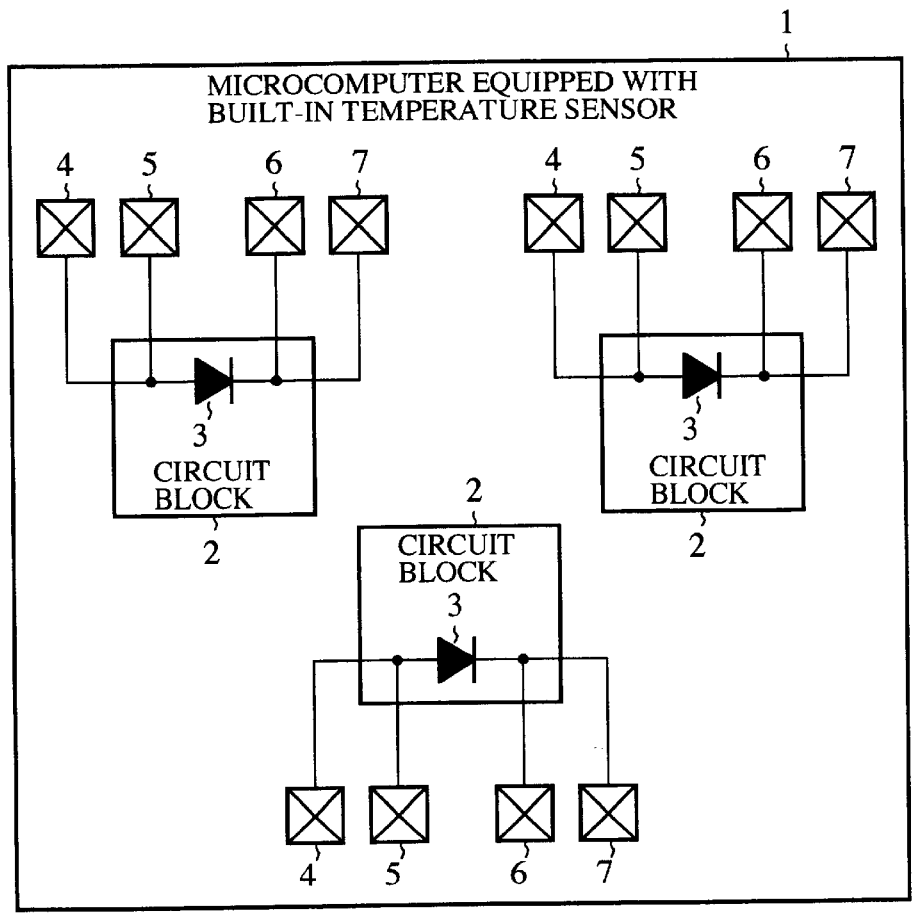
FIG. 1 is a block diagram showing a configuration of a microcomputer equipped with a built-in temperature sensor according to the first embodiment of the present invention.

FIG. 1 is a block diagram showing a configuration of a microcomputer equipped with a built-in temperature sensor according to the first embodiment of the present invention. In FIG. 1, the reference number 1 designates the microcomputer mounted on a semiconductor chip in which a temperature sensor is incorporated. The reference number 2 denotes each circuit block. The reference number 3 designates a temperature sensor made up of a diode in each circuit block 2.

The reference numbers 4 and 7 denote terminals (as a first terminal group) of the, semiconductor chip connected to the nodes of both the ends of each diode 3. Through the terminals 4 and 7, a constant current If is supplied to the diode 3.

The reference numbers 5 and 6 denote terminals (as a second terminal group) of the semiconductor chip connected to the nodes of both the ends of each diode 3. Through the terminals 5 and 6, a voltage of the diode 3 is detected and read.

FIG. 1 shows the configuration of the microcomputer 2 equipped with the built-in temperature sensor in which the diode 3 as the temperature sensor is incorporated in each of the three circuit blocks 2. However, the present invention is not limited by this configuration. It is possible to change the number of the circuit blocks 2.

Figure 2:
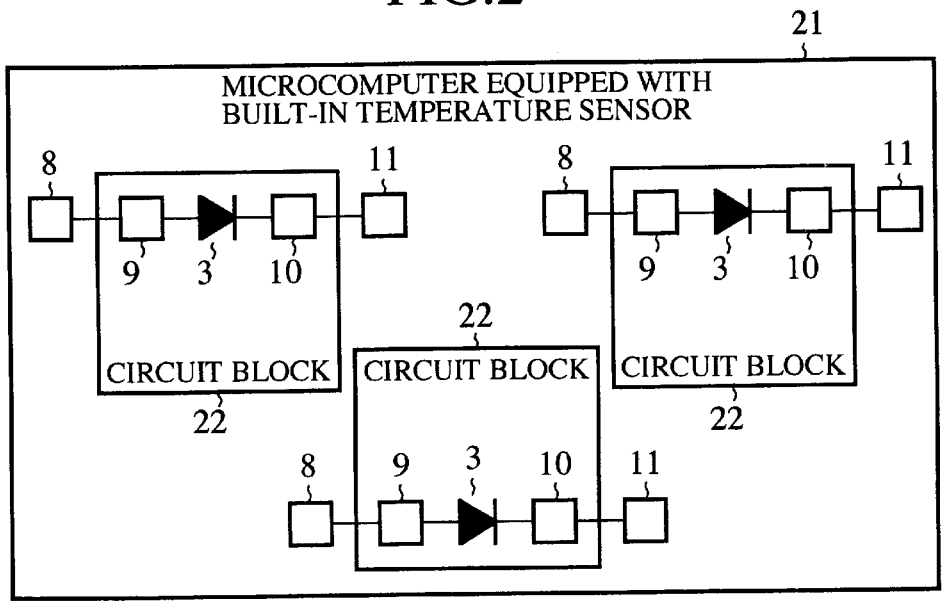
FIG. 2 is a block diagram showing another configuration of the microcomputer equipped with the built-in temperature sensor according to the first embodiment of the present invention.

FIG. 2 is a block diagram showing another configuration of the microcomputer equipped with the built-in temperature sensor according to the first embodiment of the present invention. In FIG. 2, the reference number 21 designates the microcomputer equipped with the built-in temperature sensor, 22 denotes each circuit block, 3 indicates a diode as a temperature sensor, and 8 to 11 designate pads connected to both the nodes of each diode 3. The pads 8 to 11 are different in material and configuration from the terminals 4 to 7 shown in FIG. 1. The pads 8 to 11 are made up of an aluminum layer of the uppermost layer in the semiconductor chip. FIG. 2 shows the configuration in which the temperature sensor is incorporated in each of the three circuit blocks 22. The temperature of each circuit block 22 is detected through the pads 8 to 11 connected to probes (not shown) by an external device (not shown).

Figure 3:
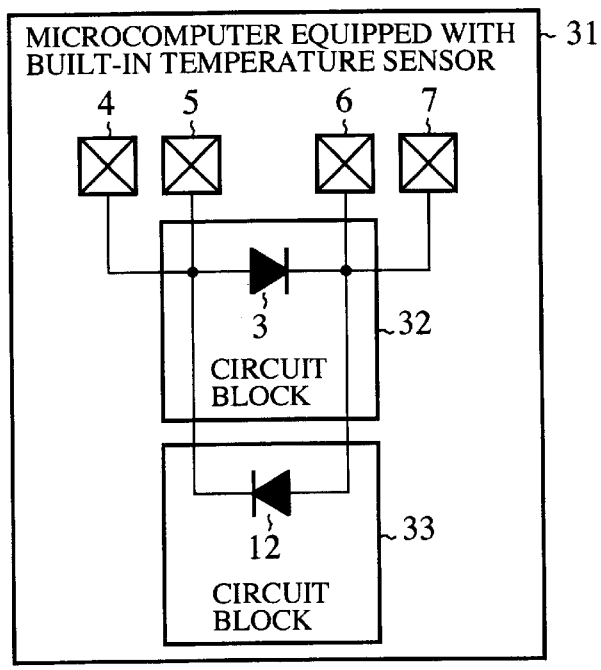
FIG. 3 is a block diagram showing another configuration of the microcomputer equipped with the built-in temperature sensor according to the first embodiment of the present invention.

FIG. 3 is a block diagram showing another configuration of the microcomputer equipped with the built-in temperature sensor according to the first embodiment of the present invention. In FIG. 3, the reference number 31 designates the microcomputer equipped with the built-in temperature sensor, 32 and 33 denote circuit blocks, 3 and 13 indicate diodes, and 4 to 7 designate terminals of the semiconductor chip connected to the both ends of each of the diodes 3 and 12. The temperature sensor is made up of each of the diodes 3 and 12. In the microcomputer 31 shown in FIG. 3, both the diodes 3 and 12 are placed in opposite direction. The temperature of each of the circuit blocks 32 and 33 is detected through the terminals 4 to 7.

Next, a description will be given of the operation of the microcomputer equipped with the built-in temperature sensor of the first embodiment.

Figure 4:
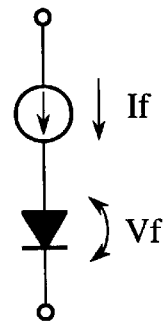
FIG. 4 is a diagram showing the operational principle of the microcomputer equipped with the built-in temperature sensor according to the present invention.

FIG. 4 is a diagram showing the operational principle of the microcomputer equipped with the built-in temperature sensor according to the first embodiment shown in FIGS. 1 to 3.

Through the terminals 4 and 7 (or through the pads 8 and 11 in the case of FIG. 2), a constant current If is supplied to the diode 3 in forward direction. At this time, the voltage Vf generated at the both ends of the diode 3 is detected through the terminals 5 and 6. In this case, no current If flows through the diode 12 because the current If is a backward current in the diode 12.

Figure 5:
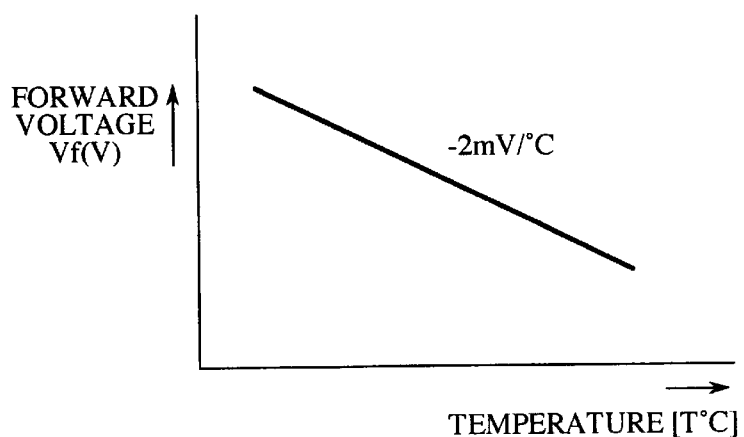
FIG. 5 is a diagram showing the operational principle of the microcomputer equipped with the built-in temperature sensor according to the present invention.

FIG. 5 is a characteristic diagram showing the relationship between the temperature T and the voltage Vf generated at the both ends of the diode shown in FIG. 4 as shown in FIG. 5, the voltage Vf is decreased linearly in proportion to the increasing of the temperature of the diode. FIG. 5 shows the case in which the temperature parameter is −2 mV/° C. For example, the voltage Vf becomes approximately 650mV generated at the both ends of the diode when the constant current If is 10 μA and the room temperature is 25° C. As a result, the relationship among the temperature coefficient of the diode, the constant current If, and the diode voltage Vf is determined based on the physical constant of the diode and the like. Accordingly, because the relationship is not changed by the fluctuation of the condition of the fabrication processes, the peripheral temperature at which the diode is located can be detected by measuring the voltage Vf at the both ends of the diode. That is to say, it is possible to use the diode as the temperature sensor.

In each microcomputer equipped with the built-in temperature sensor having the configuration shown in FIG. 1, FIG. 2, and FIG. 3, the terminals 4 and 7 (or the pads 8 and 11) through which the constant current If is supplied are different in position from the terminals 5 and 6 (or the pads 9 and 10) through which the voltage Vf is detected. The reason why is to detect the accurate voltage Vf generated at the both ends of the diode. For example, if only the two terminals in the terminals 4 to 7 (or only the two pads in the pads 8 to 11) are used to supply the constant current If and to detect the voltage Vf, a voltage drop occurs by the wiring resistance from the diode to the two terminals (or the two pads). In this case, it is impossible to detect any accurate voltage Vf.

In the microcomputer 31 equipped with the built-in temperature sensor 31, both the diodes 3 and 31 are connected to the terminals 4 to 7 in parallel, and the polarities of both the diodes 3 and 12 are opposite to each other (one is forward and other is backward). In addition, the diodes 3 and 12 are incorporated in the different circuit blocks 32 and 33, respectively. For example, when the temperature of the circuit block 32 is detected, the constant current is supplied through the terminal 4 to the terminal 7 so that the constant current If flows in the diode 3 in the circuit block 32, and then the voltage Vf generated at the both ends of the diode 3 is detected through the terminals 5 and 6 by a tester (omitted from FIG. 3) in this case, no constant current If flows through the diode 12 because the direction of the constant current If is in backward. Therefore the constant current If flows only through the diode 3 in forward direction and there is no effect from the voltage to be generated at the both ends of the diode 12 during the measuring of the voltage Vf.

The configuration of the microcomputer 31 equipped with the built-in temperature sensor shown in FIG. 3 can detect the temperature of the circuit blocks 32 and 33 in which the diodes 3 and 12 are incorporated, respectively, through the terminals 4 to 7. Since this configuration has only the four terminals 4 to 7, it is possible to reduce the terminals to be used for measuring the temperature of the circuit blocks.

As described above, according to the microcomputer equipped with the built-in temperature sensor of the first embodiment, the diode is incorporated in each circuit block, and the voltage generated at the both ends of the diode is detected through the terminals or the pads. Thereby, even if there happens that the temperature of the microcomputer in operation is over the temperature that has been predicted in a design stage, it is possible to design the microcomputer under the optimum operational margin and to avoid the occurrence of faulty operation and runaway.

Furthermore, according to the first embodiment, because the temperature of the pair of the circuit blocks is detected through the terminals which are commonly used, it is possible to reduce the total number of the terminals when compared with the case in which the terminals used for measuring the temperature are formed for each circuit block.

Second Embodiment

Figure 6:
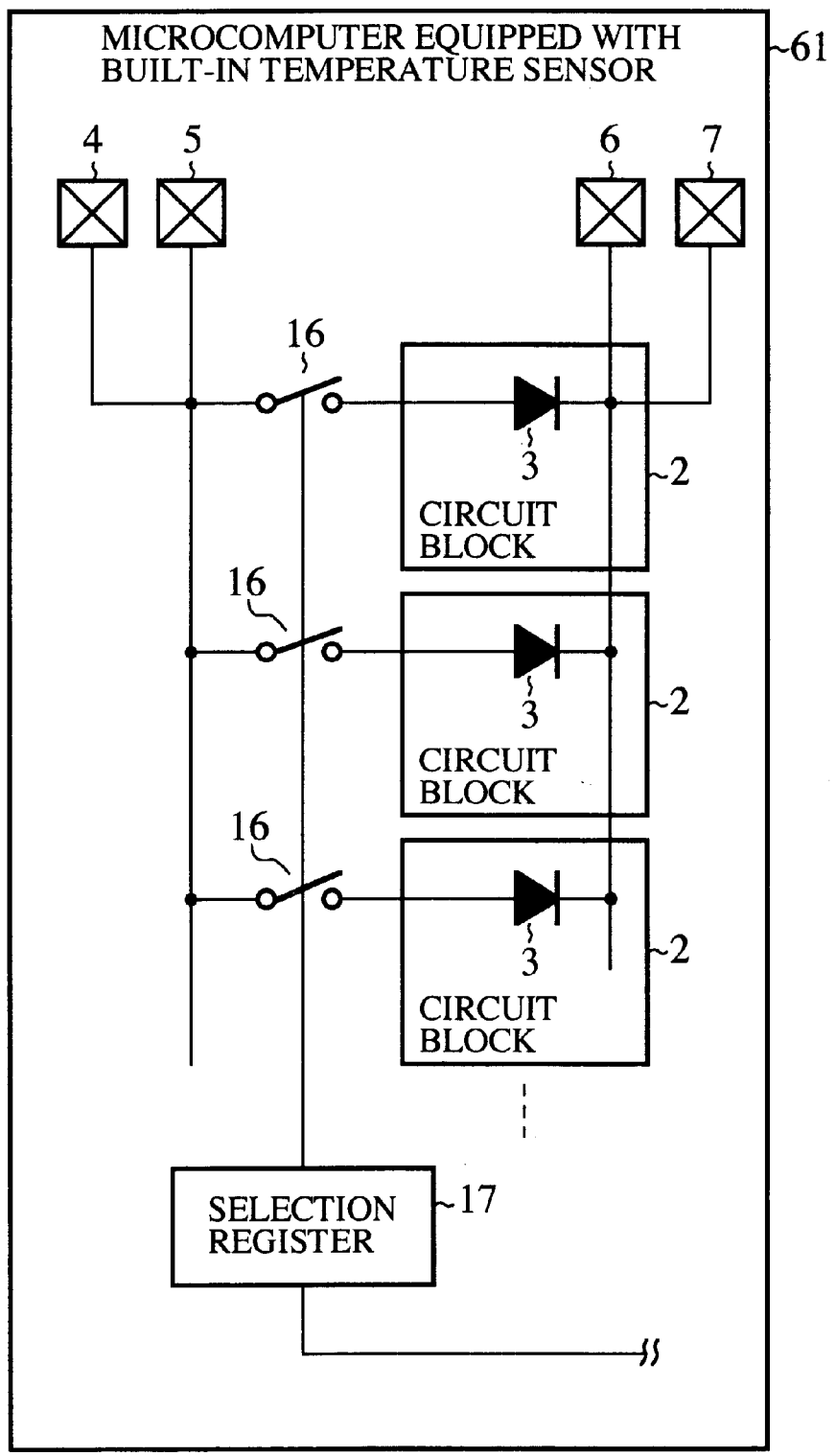
FIG. 6 is a block diagram showing a configuration of a microcomputer equipped with a built-in temperature sensor according to the second embodiment of the present invention.

FIG. 6 is a block diagram showing a configuration of a microcomputer equipped with a built-in temperature sensor according to the second embodiment of the present invention. In FIG. 6, the reference number 61 designates the microcomputer equipped with the built-in temperature sensor mounted on a semiconductor chip. The reference number 2 denotes a plurality of circuit blocks, and 3 indicates a diode as a temperature sensor incorporated in each circuit block 2. The reference numbers 4 to 7 designate terminals that are commonly formed and used for the diodes 3 in the plurality of the circuit blocks 2. The reference number 16 designates each of selection switches for selecting one of the circuit blocks 2, and each switch 16 corresponds to each circuit block 2. The reference number 17 indicates a selection register in which a value to select one of the switches 16 is stored.

Figure 7:
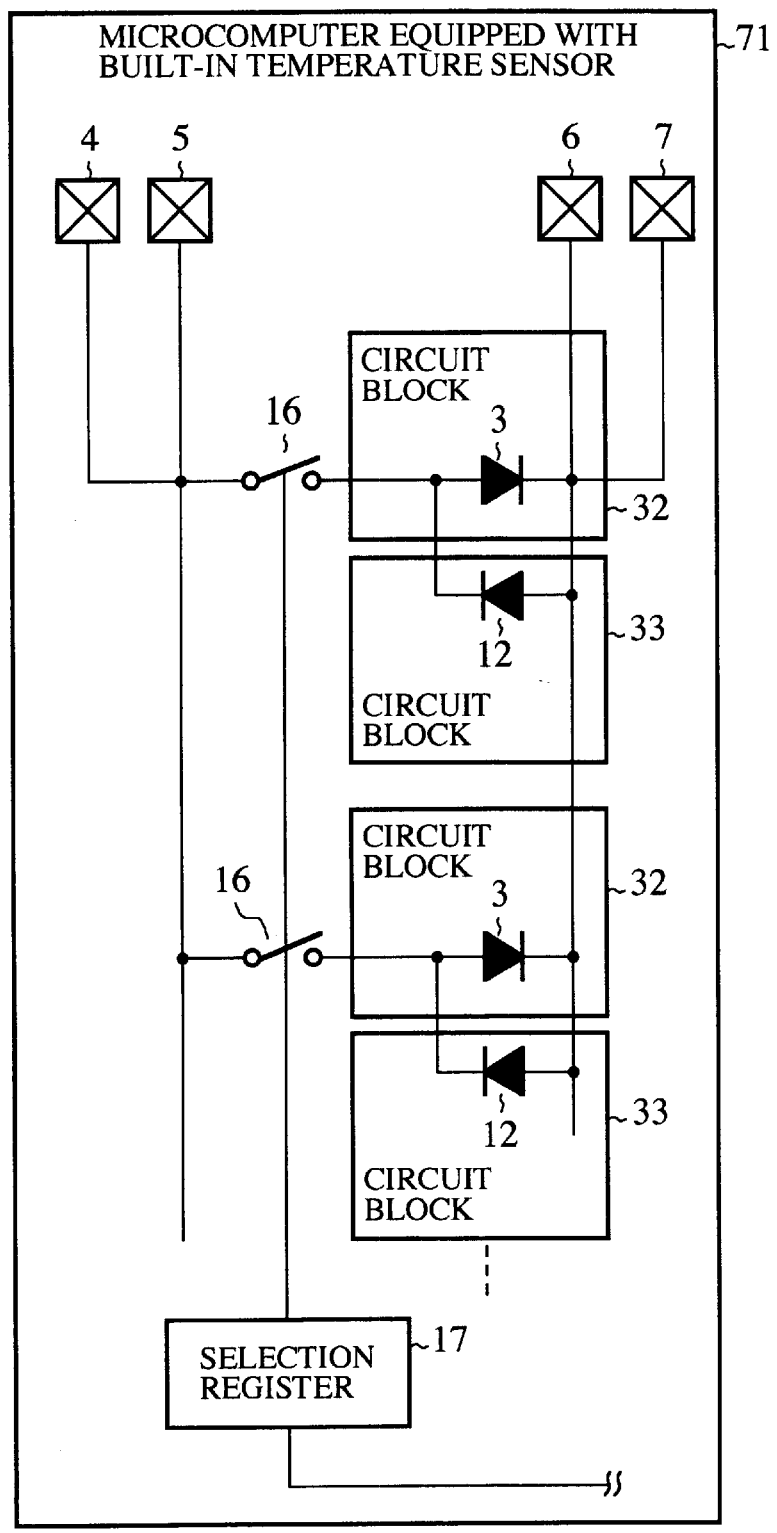
FIG. 7 is a block diagram showing another configuration of the microcomputer equipped with the built-in temperature sensor according to the second embodiment of the present invention.

FIG. 7 is a block diagram showing another configuration of the microcomputer 61 equipped with the built-in temperature sensor shown in FIG. 6 according to the second embodiment of the present invention. In FIG. 7, the reference number 71 designates the microcomputer 61 equipped with the temperature sensor, the 32 and 33 denote a pair of circuit blocks. In the pair of the circuit blocks 32 and 33, the diodes 3 and 12 are incorporated as temperature sensors, shown in FIG. 3. The terminals 4 to 7 are commonly used for all of the pairs of the circuit blocks, each pair consists of the circuit blocks 32 and 33. Other circuit components shown in FIG. 7 are the same as the circuit components shown in FIG. 6. Accordingly, the same reference numbers will be used.

Next, a description will be given of the operation of the microcomputer equipped with the built-in temperature sensor according to the second embodiment.

In the configuration of the microcomputer 61 equipped with the temperature sensor shown in FIG. 6, the forward constant current If is supplied only to the diode 3 in the circuit block 2 through the terminals 4 and 7 that are commonly used for the plurality of the circuit blocks 2. This circuit block 2 is selected by the corresponding selection switch 16 based on the value stored in the selection register 17.

The selection register 17 stores the value set by a control means (not shown) such as a CPU. One of the switches 16 is selected based on the value set in the selection register 17. The voltage generated at the both ends of the diode 3 in the circuit block 2 selected by the corresponding selection switch 16 is measured through the terminals 5 and 6.

On the other hand, the microcomputer 71 equipped with the built-in temperature sensor 71 shown in FIG. 7, the diodes 3 and 12 are incorporated in each pair of the circuit blocks 32 and 33. In this configuration, the constant current If is supplied to the diode 3 and the diode 12 through the terminals 4 and 7 that are commonly used in order to measure the temperature of the circuit blocks 32 and 33.

As written above, the microcomputer equipped with the built-in temperature sensor shown in FIG. 7 comprises a plurality of pairs of the circuit block pairs 32 and 33, each pair consists of the circuit blocks 32 and 33. The constant current If in forward direction is supplied through the terminals 4 and 7 that are commonly used for the plurality of pairs of the circuit blocks 32 and 33. At the time, one of the pairs of the circuit blocks 32 and 33 is selected by the corresponding selection switch 16 that is selected according to the value set in the selection register 17. The selection of the diodes 3 and 12 in the selected pair of the circuit blocks 32 and 33 is executed in the same manner in the microcomputer 31 equipped with the built-in temperature sensor of the first embodiment shown in FIG. 3. Accordingly, the detailed explanation for the selection of the diodes 3 and 12 is omitted here. For example, when the constant current If, that is a forward current for the diode 3 incorporated in the circuit block 32 in a pair, is supplied through the terminals 4 and 7, this constant current If becomes a backward current for the diode 12 in other circuit block 33 in the pair. Accordingly, no current flows through the diode 12.

As described above, according to the microcomputer equipped with the built-in temperature sensor of the second embodiment, the selection switches 16 can select the diode incorporated in the circuit block, or the diodes incorporated in the pair of the circuit blocks according to the value set in the selection register 17. Thereby, even if the temperature of the microcomputer in operation rises over the temperature predicted in a design stage, it is possible to avoid the occurrence of faulty operation and runaway of the microcomputer. Furthermore, according to the second embodiment, because it is so designed that the terminals are commonly used,it is possible to reduce the total number of the terminals in the semiconductor chip. In addition, it is possible to design the microcomputer having the optimum operational margin.

Third Embodiment

Figure 8:
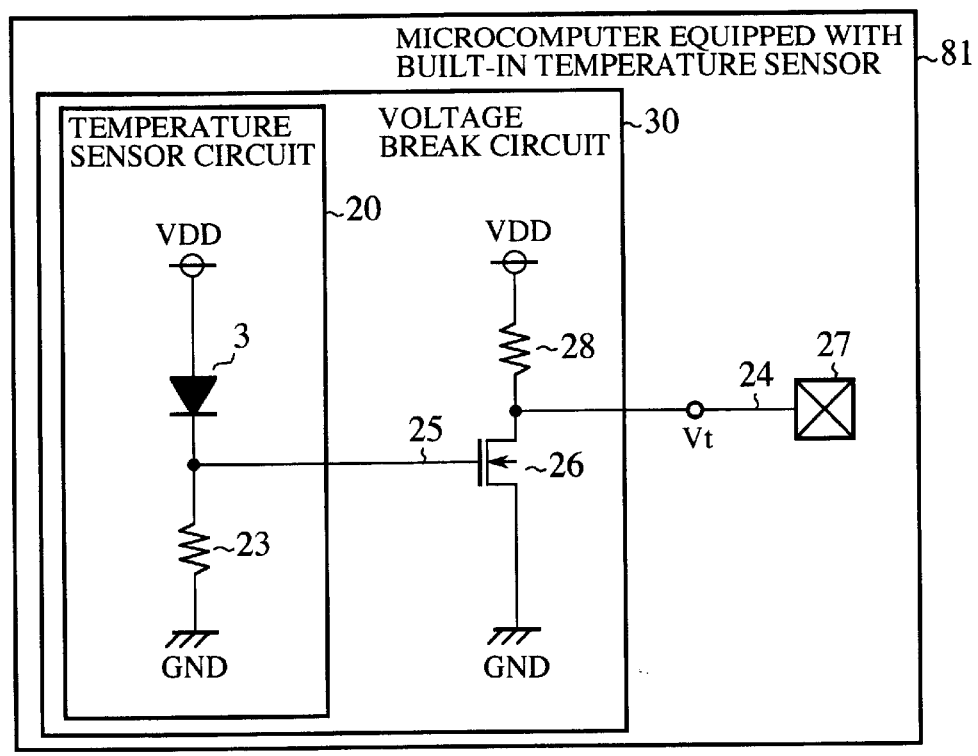
FIG. 8 is a block diagram showing a configuration of a microcomputer equipped with a built-in temperature sensor according to the third embodiment of the present invention.

FIG. 8 is a block diagram showing a configuration of a microcomputer equipped with a built-in temperature sensor according to the third embodiment of the present invention. In FIG. 8, the reference number 81 designates the microcomputer equipped with the built-in temperature sensor mounted on a semiconductor chip. The reference number 20 denotes a temperature sensor circuit comprising a diode 3 as a temperature sensor and a resistance 23 as a first resistance. The diode 3 and the resistance 23 are connected in series between a power voltage source as a first power voltage source VDD and a ground voltage GND as a second power voltage source.

The reference number 28 denotes a resistance as a second resistance, 26 indicates a N channel MOS transistor as a first MOS transistor connected between the power voltage source VDD and the ground voltage GND.

The gate of the N channel MOS transistor 26 is connected to a first node 25 through which the diode 3 is also connected to the resistance 23 in the temperature sensor circuit 20.

The reference number 27 designates a terminal connected to a second node 24 through which the resistance 28 is also connected to the N channel MOS transistor 26. The reference number 30 denotes a voltage break circuit comprising the temperature sensor circuit 20, the resistance 28, and the N channel MOS transistor 26. The resistance 28 and the N channel MOS transistor 26 forms a MOS inverter circuit.

Next, a description will be given of the operation of the microcomputer equipped with the built-in temperature sensor according to the third embodiment.

Figure 9:
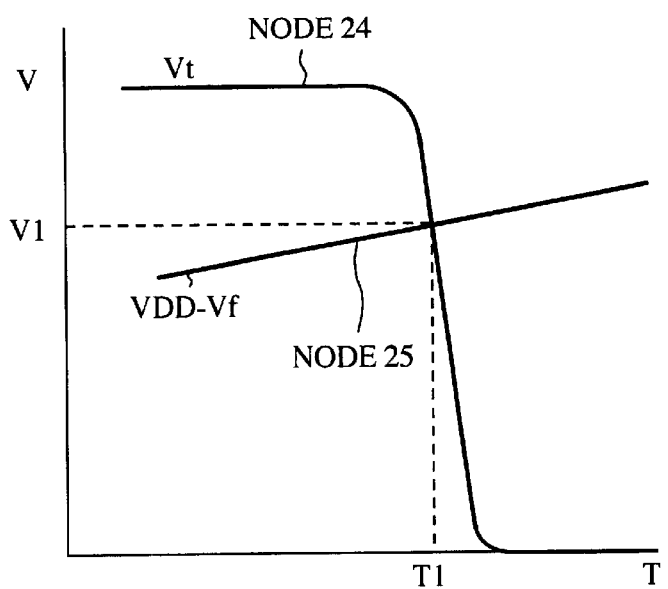
FIG. 9 is a block diagram showing the principle of the operation of a voltage break circuit incorporated in the microcomputer according to the present invention.

FIG. 9 is a block diagram showing the principle of the operation of the voltage break circuit 30 incorporated in the microcomputer 81 shown in FIG. 8. FIG. 9 shows the relationship between the voltage (VDD−Vf) at the first node 25 and the voltage Vt at the second node 24.

As set forth in the first embodiment, because the voltage drop in the diode 3, namely the value of the forward voltage of the diode 3 becomes small when a peripheral temperature of the diode 3 rises, the voltage at the first node 25 becomes large according to the increasing the temperature.

The threshold value of the N channel MOS transistor 26 corresponding to the voltage V1 of the first node 25 at the temperature T1 in which the voltage break circuit 30 works is set. The threshold value can be determined by adjusting a conductance rate between the N channel MOS transistor and the resistance 28. When the voltage (VDD−Vf) is equal to the threshold voltage of the N channel MOS transistor 26 under the increasing of the temperature, namely when the voltage V1=VDD−Vf, the N channel MOS transistor 26 enters ON. Accordingly, the peripheral temperature of the diode 3 is over the set temperature T1, the voltage Vt at the second node 24 changes from the H level to the L level. Thereby, a control signal of the L level is output to an external device (not shown) through the terminal 27. By checking the level of the control signal, the external device can detect that the peripheral temperature of the area in which the diode 3 is incorporated becomes over the predetermined temperature.

Figure 10:
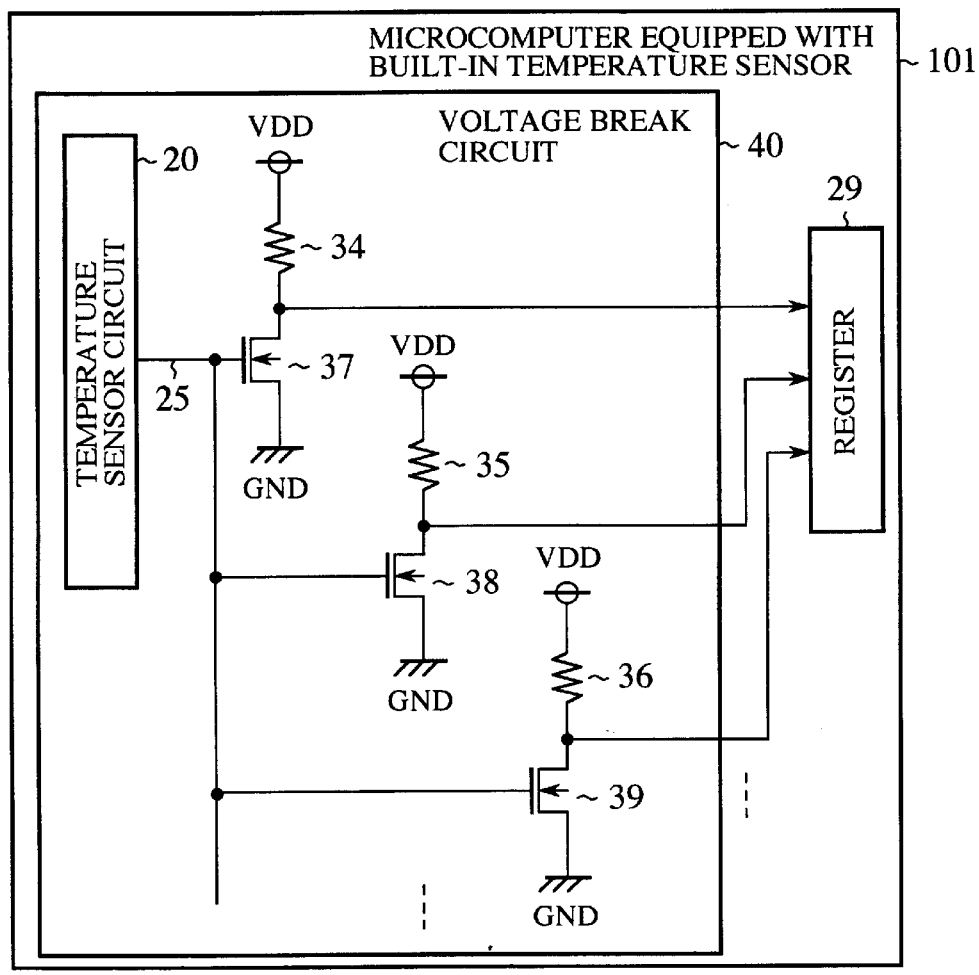
FIG. 10 is a block diagram showing another configuration of the microcomputer equipped with the built-in temperature sensor according to the third embodiment of the present invention.

FIG. 10 is a block diagram showing another configuration of the microcomputer 81 equipped with the built-in temperature sensor shown in FIG. 8. The reference number 101 designates the microcomputer equipped with the built-in temperature sensor, and 20 denotes the temperature sensor circuit that corresponds to one shown in FIG. 8. The reference number 34, 35, and 36 indicate resistances as a second resistance, and 37, 38, and 39 indicate N channel MOS transistors. The reference number 40 designates the voltage break circuit in which the temperature sensor circuit 20 is incorporated.

In the voltage drop circuit 40 shown in FIG. 10, both the resistance 34 and the N channel MOS transistor 37 are connected in series between the power voltage source VDD and the ground voltage GND. Similarly, both the resistance 35 and the N channel MOS transistor 38 are connected in series between the power voltage source VDD and the ground voltage GND. Both the resistance 36 and the N channel MOS transistor 39 are connected in series between the power voltage source VDD and the ground voltage GND. In addition, the gate of each of the N channel MOS transistors 37, 38, and 39 is connected to the first node 25.

The reference number 29 designates a register in which a value corresponding to the voltage at the connection node of the resistance 34 and the N channel MOS transistor 37 is stored. Similarly, a value corresponding to the voltage at the connection node of the resistance 35 and the N channel MOS transistor 38 is stored in the register 29. A value corresponding to the voltage at the connection node of the resistance 36 and the N channel MOS transistor 39 is stored in the register 29.

In the third embodiment, the threshold values of the N channel MOS transistors 37, 38, and 39 are set stepwise. That is to say, the temperatures at which the N channel MOS transistors 37, 38, and 39 become ON can be set in stages by setting stepwise the ratio of the resistance and the conductance of the N channel MOS transistor. This configuration can detect stepwise the peripheral temperature of the diode 3 (which is omitted from FIG. 10. See FIG. 9) incorporated in the temperature sensor circuit 20.

For example, the temperature at the peripheral area of the diode 3 can be monitored by reading the value stored in the register 29 by a control means such as a CPU (omitted from FIG. 10) reads.

Figure 11:
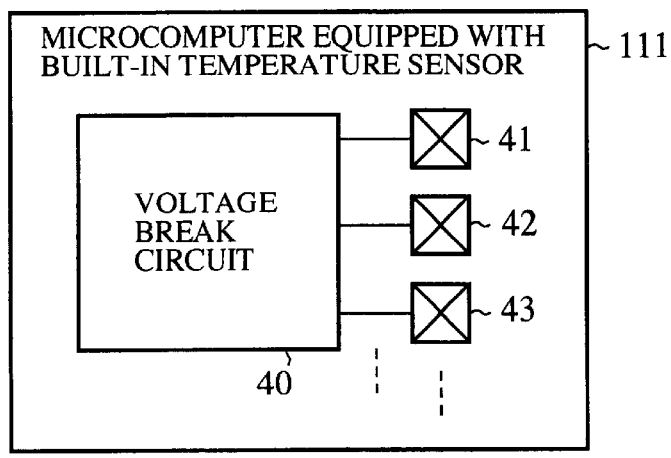
FIG. 11 is a block diagram showing another configuration of the microcomputer equipped with the built-in temperature sensor according to the third embodiment of the present invention.

FIG. 11 is a block diagram showing another configuration of the microcomputer 101 equipped with the built-in temperature sensor shown in FIG. 10. In FIG. 11, the reference number 111 designates the microcomputer equipped with the built-in temperature sensor, and 41, 42, and 43 denote terminals. In the configuration shown in FIG. 11, the plurality of wiring through which the voltage break circuit 40 is connected are connected to the terminals 41, 42, and 43 instead of the register 29 shown in FIG. 10. Accordingly, an external device (not shown) can monitor stepwise whether or not the temperature of the peripheral area of the diode 3 is within each of prescribed values.

Figure 12:
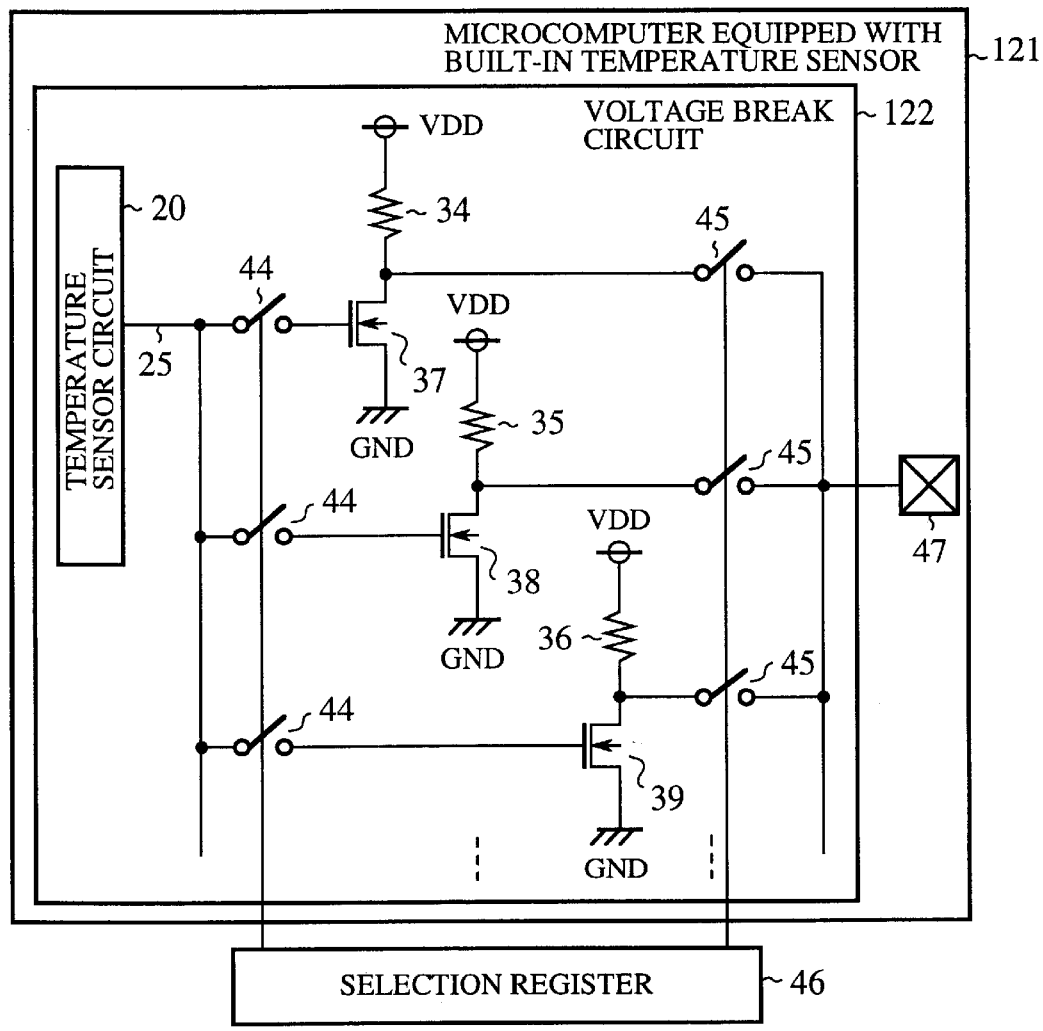
FIG. 12 is a block diagram showing another configuration of the microcomputer equipped with the built-in temperature sensor according to the third embodiment of the present invention.

FIG. 12 is a block diagram showing another configuration of the microcomputer 101 equipped with the built-in temperature sensor shown in FIG. 10. In FIG. 12, the reference number 212 designates the microcomputer equipped with the built-in temperature sensor, and 122 denotes the voltage break circuit in which the temperature sensor circuit 20 is incorporated.

The reference numbers 44 and 45 denote selection switches located in the voltage break circuit 122. The circuit components other than the selection switches 44 and 45 in the voltage break circuit 122 are the same as the circuit components shown in FIG. 10. Accordingly, the same reference numbers will be used.

The reference number 46 indicates a selection register corresponding in function to the selection register 17 shown in FIG. 6. The reference number 47 designates a terminal. The voltage output from the temperature sensor circuit 20 is transferred to the gate of the N channel MOS transistor selected by the corresponding selection switch 44 through the first node 25. Similar to the configuration shown in FIG. 10, the threshold values of the N channel MOS transistors 37, 38, and 39 are set stepwise.

As written above, based on the value set in the selection register 46, the first node 25 is connected to one of the N channel MOS transistors 37, 38, and 39 through the corresponding selection switche 44. The voltage at the node between the N channel MOS transistor and the corresponding resister thereof is transferred to the terminal 47 through the corresponding selection switch 45 which is selected based on the value in the selection register 46.

The external device (not shown) can thereby monitor whether or not the temperature at the peripheral area of the diode 3 incorporated in the temperature sensor circuit 20 becomes over the predetermined value.

As described above, according to the third embodiment, the voltage break circuit having the temperature sensor circuit and the plurality of the inverter circuits, the threshold values of which are different to each other. It is thereby possible to monitor the temperature of the semiconductor chip stepwise. In addition, one of the inverter circuits having different threshold values can be selected based on the value set in the selection register. Accordingly, it is possible to set a range of acceptable temperature of the semiconductor chip for desired applications. Further, even if the temperature of the semiconductor chip becomes over an acceptable temperature, it is possible to design the microcomputer of the optimum operational-margin, capable of preventing the occurrence of faulty operation and runaway of the microcomputer.

Fourth Embodiment

Figure 13:
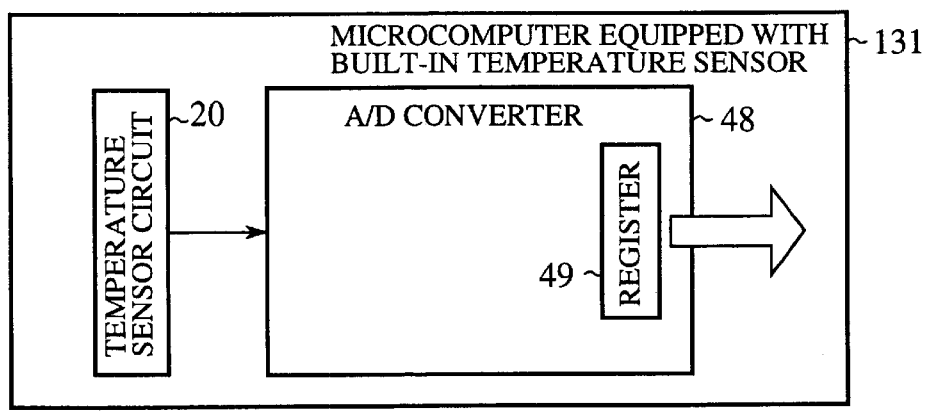
FIG. 13 is a block diagram showing a configuration of a microcomputer equipped with a built-in temperature sensor according to the fourth embodiment of the present invention.

FIG. 13 is a block diagram showing a configuration of a microcomputer equipped with a built-in temperature sensor according to the fourth embodiment of the present invention. In FIG. 13, the reference number 131 designates the microcomputer equipped with the built-in temperature sensor mounted on a semiconductor chip. The reference number 48 designates an analogue to digital converter (A/D converter) for converting an analogue voltage signal output from the temperature sensor circuit 20 to a digital voltage signal. The reference number 49 indicates a register incorporated in the A/D converter 48. The microcomputer 131 equipped with the built-in temperature sensor comprises the temperature sensor 20 in the voltage break circuit 30 and the A/D converter 48.

Next, a description will be given of the operation of the microcomputer 131 equipped with the built-in temperature sensor according to the fourth embodiment.

The control voltage signal Vt output from the temperature sensor circuit 20 is output to the A/D converter 48. This control voltage signal Vt is converted to a digital voltage signal by the A/D converter 48 and the converted digital voltage signal is then stored into the register 49. A control means such as a CPU (not shown) can monitor the temperature of the peripheral area of the diode 3 in the temperature sensor circuit 20 by reading the value stored in the register 49.

Figure 14:
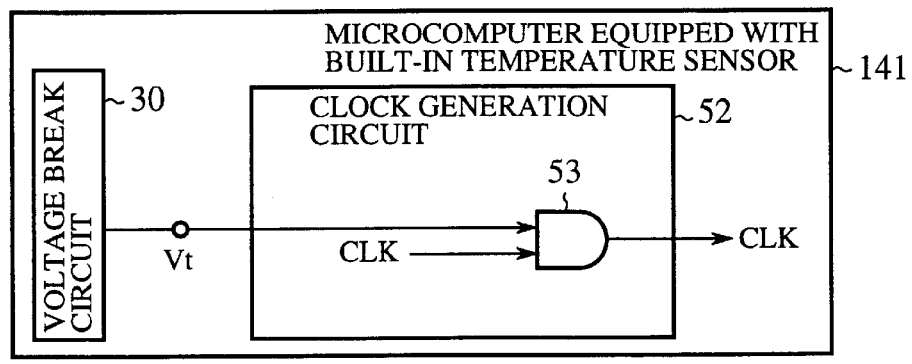
FIG. 14 is a block diagram showing another configuration of the microcomputer equipped with the built-in temperature sensor according to the fourth embodiment of the present invention.

FIG. 14 is a block diagram showing another configuration of the microcomputer equipped with the built-in temperature sensor shown in FIG. 13. In FIG. 14, the reference number 141 designates the microcomputer 141 equipped with the built-in temperature sensor, 52 indicates a clock generation circuit, and 53 denotes an AND circuit incorporated in the clock generation circuit 52. The reference number 30 designates a voltage break circuit which corresponds to the voltage break circuit 30 shown in FIG. 8. The AND circuit 53 inputs both two signals, the control voltage signal Vt output from the voltage break circuit 30, and the clock signal CLK.

During the operation of the microcomputer 141 to which the clock signal CLK is provided, when the temperature of the semiconductor chip on which the microcomputer 141 is mounted rises over the predetermined temperature, as has been explained in the case shown in FIG. 8, the level of the control voltage signal Vt becomes the L level. Accordingly, the clock signal CLK output from the AND circuit 53 becomes L level. The operation of the microcomputer is interrupted according to a halt of the supply of the clock signal.

After this, when the temperature of the semiconductor chip falls under the predetermined temperature, the level of the control voltage signal VT output from the voltage break circuit 30 is returned to the H level, the AND circuit 53 outputs the clock signal CLK continuously. Thereby, it is possible to prevent the occurrence of faulty operation or runaway of the microcomputer 141, because the supply of the clock signal CLX can be interrupted even if the temperature of the semiconductor chip is increased over the predetermined temperature.

Figure 15:
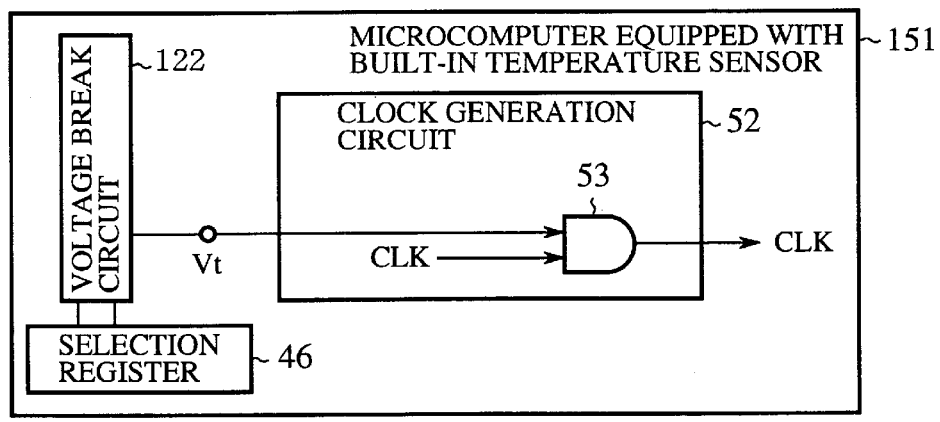
FIG. 15 is a block diagram showing another configuration of the microcomputer equipped with the built-in temperature sensor according to the fourth embodiment of the present invention.

FIG. 15 is a block diagram showing another configuration of the microcomputer 141 equipped with the built-in temperature sensor shown in FIG. 14. In the configuration shown in FIG. 15, the voltage break circuit 30 shown in FIG. 14 is replaced with the temperature sensor circuit 20 having the configuration shown in FIG. 12. In FIG. 15, the reference number 151 designates the microcomputer equipped with the built-in temperature sensor In FIG. 15, the selection register 46 corresponds to the selection register shown in FIG. 12, the clock generation circuit 52 corresponds to the clock generation circuit shown in FIG. 14. By forming the microcomputer 151 equipped with the built-in temperature sensor based on the configuration shown in FIG. 15, it is possible to set the temperature stepwise at which the voltage break circuit 122 operates. Thus, the stepwise-set values corresponding to the set temperatures are stored in the selection register 46 similar to the microcomputer equipped with the built-in temperature sensor shown in FIG. 14. It is therefore possible to set a range of acceptable temperature of the semiconductor chip for desired applications, and it is possible to prevent the occurrence of faulty operation and runaway of the microcomputer 151.

Figure 16:
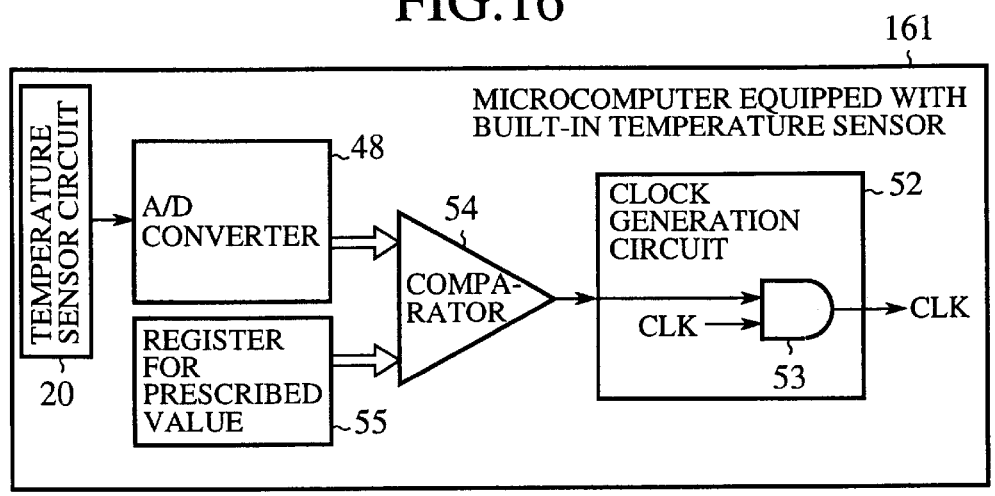
FIG. 16 is a block diagram showing another configuration of the microcomputer equipped with the built-in temperature sensor according to the fourth embodiment of the present invention.

FIG. 16 is a block diagram showing another configuration of the microcomputer 131 equipped with the built-in temperature sensor shown in FIG. 13. In FIG. 16, the reference number 161 designates the microcomputer equipped with the built-in temperature sensor. The reference number 55 designates a register for storing a prescribed value, to which a control means such as a CPU (not shown) writes a specified value. The reference number 54 denotes a comparator for comparing the output from the A/D converter 48 and the value set in the register 55 for the prescribed value, and then outputting a comparison result to the clock signal generation circuit 52. Since the configuration of each of the temperature sensor circuit 20, the A/D converter 48, and the clock generation circuit 52 is the same as that of the cases shown in FIG. 13 and FIG. 14, the explanation for the same circuit components is omitted here and the same reference numbers will be used.

The comparator 54 compares the prescribed value stored in the register 55 with the output from the A/D converter 48. When the output from the A/D converter 48 is smaller than the prescribed value in the register 55, the comparator 54 outputs a signal of the H level as a comparison result, and when not, the comparator 54 outputs a signal of the L level as a comparison result.

Since the operation of the clock generation circuit 52 is the same as that of the case in the microcomputer 141 equipped with the built-in temperature sensor shown in FIG. 14, the explanation of the operation of the clock generation circuit 52 is omitted here.

As written above, when the temperature of the semiconductor chip is over the prescribed value during the operation of the microcomputer based on the clock signal CLK, the comparator 54 outputs the signal of the L level. In this case, the clock generation circuit 52 halts to supply the clock signal CLK, and the operation of the microcomputer thereby stops.

After this, when the temperature of the semiconductor chip is decreased under the prescribed value, because the comparator 54 outputs the signal of the H level, the clock generation circuit 52 generates again and outputs the clock signal CLK continuously to the microcomputer 161. Accordingly, the microcomputer 161 restarts the normal operation. Thus, even if the temperature of the semiconductor chip rises over the prescribed value, it is possible to prevent the occurrence of faulty operation and runaway of the microcomputer 161.

Figure 17:
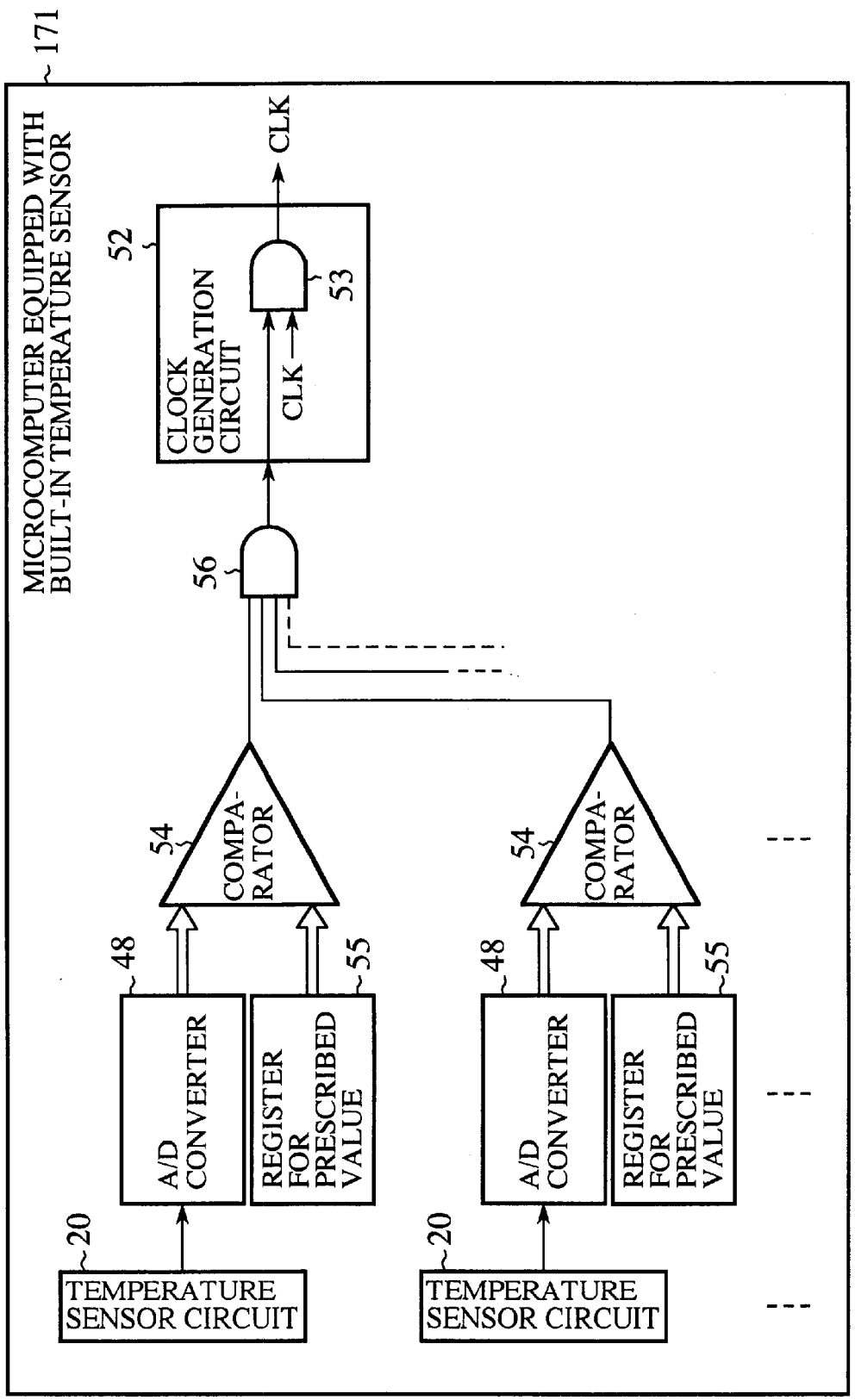
FIG. 17 is a block diagram showing another configuration of the microcomputer equipped with the built-in temperature sensor according to the fourth embodiment of the present invention.

FIG. 17 is a block diagram showing another configuration of the microcomputer equipped with the built-in temperature sensor 161 shown in FIG. 16. In FIG. 17, the reference number 171 designates the microcomputer equipped with the built-in temperature sensor, the reference number 56 denotes an AND circuit for performing a logical product (AND operation) between outputs from a plurality of comparators 54. The output from the AND circuit 56 is provided to the clock generation circuit 52. The configuration and the operation of the clock generation circuit 52 is the same as that of the clock generation circuit shown in FIG. 14.

Thus, in the configuration shown in FIG. 17, a plurality of circuit blocks, each incorporating the temperature sensor circuit 20. (the configuration of each circuit block is shown in FIG. 16), are arranged in parallel. That is to say, the temperature sensor circuit 20 is incorporated in each circuit block. When the temperature of the peripheral area of one of the plurality of the circuit blocks becomes over the prescribed value, the clock generation circuit 52 can halt to supply the clock signal CLK because the AND circuit outputs the signal of the L level.

In a case that an OR circuit is incorporated instead of the AND circuit, the clock generation circuit 52 can halts to supply the clock signal CLK only when the temperatures of all of the circuit blocks are over the prescribed value. It is therefore possible to incorporate one of the AND circuit and OR circuit according to desired applications.

As described above, according to the fourth embodiment, the generation and the supply of the clock signal CLK in the clock generation circuit is controlled based on the value of the analogue voltage transferred from the temperature sensor circuit or the voltage break circuit. In addition, the generation and the supply of the clock signal CLK in the clock generation circuit is controlled based on the comparison result obtained by comparing the digital voltage value which is converted from the analogue voltage value by the A/D converter with the prescribed value stored in the register. It is possible to provide the temperature monitor circuit with a high degree of precision and with a high degree of flexibility in temperature setting, when compared with the configuration having the inverter circuit. Accordingly, because the generation and the supply of the clock signal in the clock generation circuit can be stopped temporarily while the temperature of the semiconductor chip is over the prescribed value, it is possible to prevent the occurrence of faulty operation and runaway of the microcomputer.

Fifth Embodiment

Figure 18:
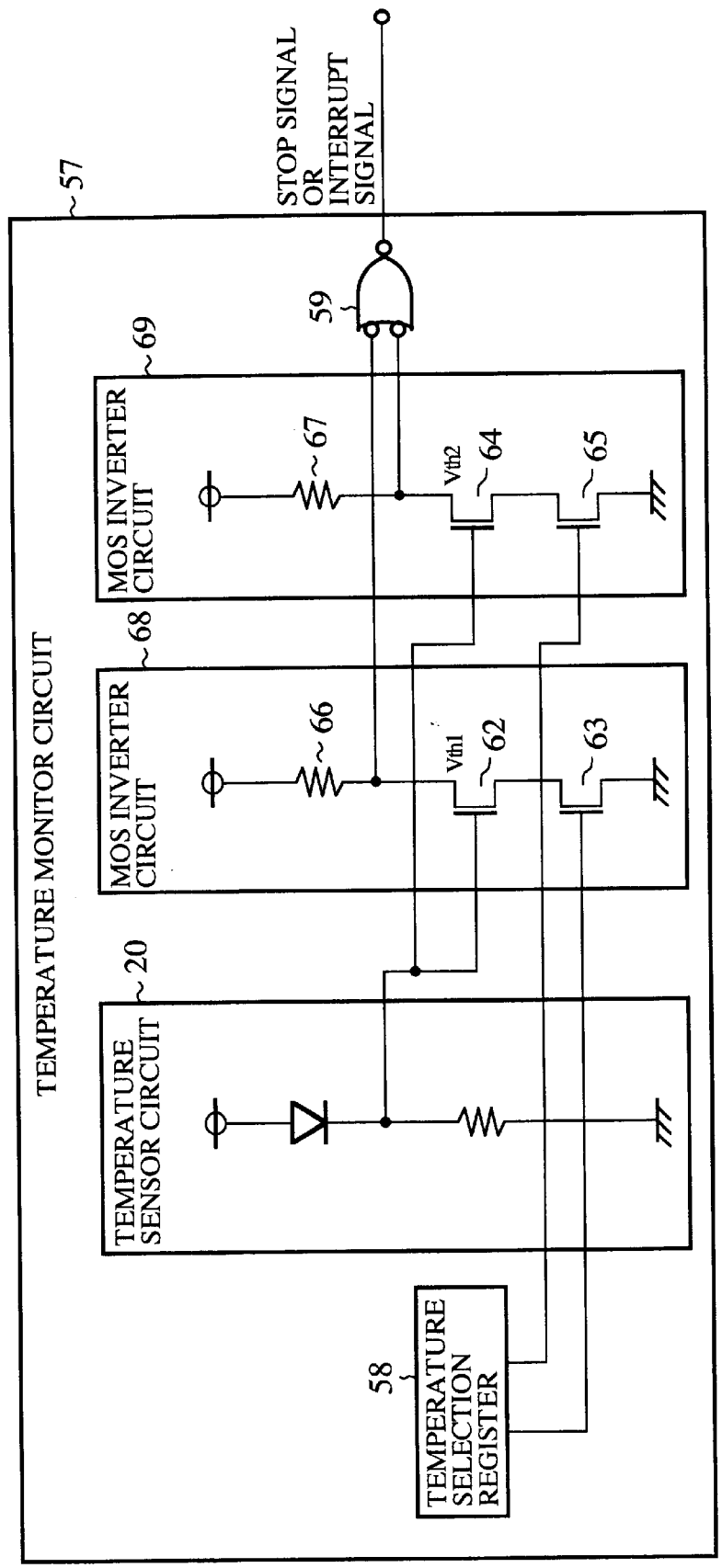
FIG. 18 is a block diagram showing a configuration of a temperature monitor circuit incorporated in a microcomputer according to the fifth embodiment of the present invention.

FIG. 18 is a block diagram showing a configuration of a temperature monitor circuit to be incorporated in a microcomputer according to the fifth embodiment of the present invention. In FIG. 18, the reference number 20 designates a temperature sensor corresponding to the temperature sensor 20 shown in FIG. 8. The reference number 57 denotes a temperature monitor circuit, 58 indicates a temperature selection register, and 59 designates NOR gate. The reference numbers 62 and 64 denote N channel MOS transistors as a first MOS transistor. The MOS transistors 62, 64 have different threshold values to each other. The reference numbers 63 and 65 denote N channel MOS transistors as a second N channel MOS transistor. The reference numbers 66 and 67 designate resistances as a second resistance, and 68 and 69 denote MOS inverter circuits.

The MOS inverter 68 consists of the two N channel MOS transistors 62 and 63, and the resister 66. The inverter circuit 69 consists of the two N channel MOS transistors 64 and 65, and the resister 67. A control means such as a CPU (not shown) writes a value into the temperature selection register 58 and selects one of the inverter circuit 68 and 69, or both the inverter circuits 68 and 69.

Next, a description will be given of the operation of the microcomputer equipped with the built-in temperature sensor.

Because the N channel MOS transistors 62 and 64 in the two inverter circuits 68 and 69 have different threshold values, respectively, one of or both the N channel MOS transistors 68 and 69 are ON according to the signal output from the temperature sensor 20, and the inverter circuits 68 and 69 output the signal to the NOR gate 59.

Because the gates of the N channel MOS transistors 63 and 65 in the two inverter circuits 68 and 69 are connected to the temperature selection register 58, one of or both the N channel MOS transistors 63 and 65 are ON or OFF according to the prescribed values stored in the temperature selection register 58. For example, the prescribed value corresponding to the N channel MOS transistor 63 stored in the temperature selection register 58 indicates the non-selection of the N channel MOS transistor 63, the N channel MOS transistor 63 enters a OFF state, and the inverter circuit 68 outputs the output signal of the H level to the NOR gate 59.

On the contrary, the prescribed value corresponding to the N channel MOS transistor 63 stored in the temperature selection register 58 indicates the selection of the N channel MOS transistor 63. The N channel MOS transistor 63 enters a ON state, and the inverter circuit 68 outputs the output signal of the L level to the NOR gate 59. The NOR gate 59 performs the NOR operation and outputs the arithmetic result as a stop signal to an external device (not shown) that is located at outside of the temperature monitor circuit 57. Thus, because the temperature monitor circuit 57 has the configuration described above, it is thereby possible to monitor the temperature of a circuit block in which the temperature sensor circuit 20 is incorporated according to applications.

Figure 19:
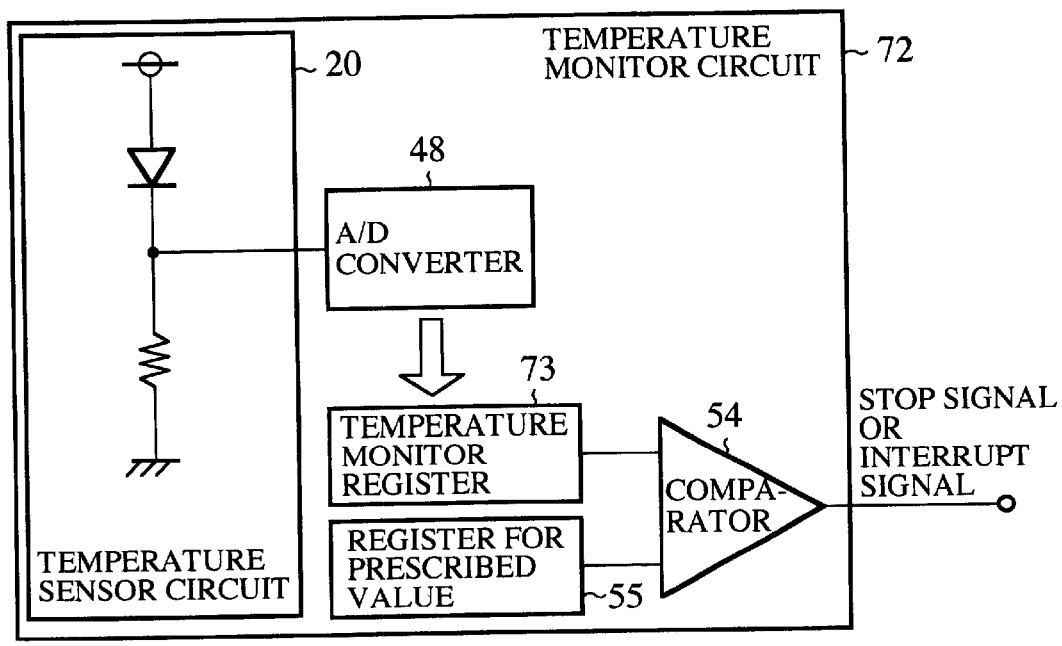
FIG. 19 is a block diagram showing another configuration of the temperature monitor circuit incorporated in the microcomputer according to the fifth embodiment of the present invention.

FIG. 19 is a block diagram showing another configuration of the temperature monitor circuit 57 shown in FIG. 18. In FIG. 72, the reference number 72 designates a temperature monitor circuit, 73 indicates a temperature monitor register in which the output value from the A/D converter 48 is stored. Other circuit components are the same as those in the configuration shown in FIG. 16. Accordingly, the explanation of them is omitted and the same reference numbers will be used.

In the configuration shown in FIG. 19, the A/D converter 48 converts an analogue voltage value which is proportional to a temperature detected by and output from the temperature sensor circuit 20 to a digital voltage value, and then transfers it to the temperature monitor register 73. The temperature monitor register 73 stores the digital voltage value. The comparator 54 compares the digital voltage value stored in the temperature monitor register 74 with the prescribed value stored in the register 55, and outputs a comparison result as the stop signal (namely, a control signal) to the external device (not shown).

Thus, because the analogue voltage value which is proportional to the temperature detected by and output from the temperature sensor circuit 20 is converted to the digital voltage value, and the digital voltage value is then compared with the prescribed value stored in the register 55, it is possible to provide the temperature monitor circuit with a high degree of precision and with a high degree of flexibility in temperature setting.

Figure 20:
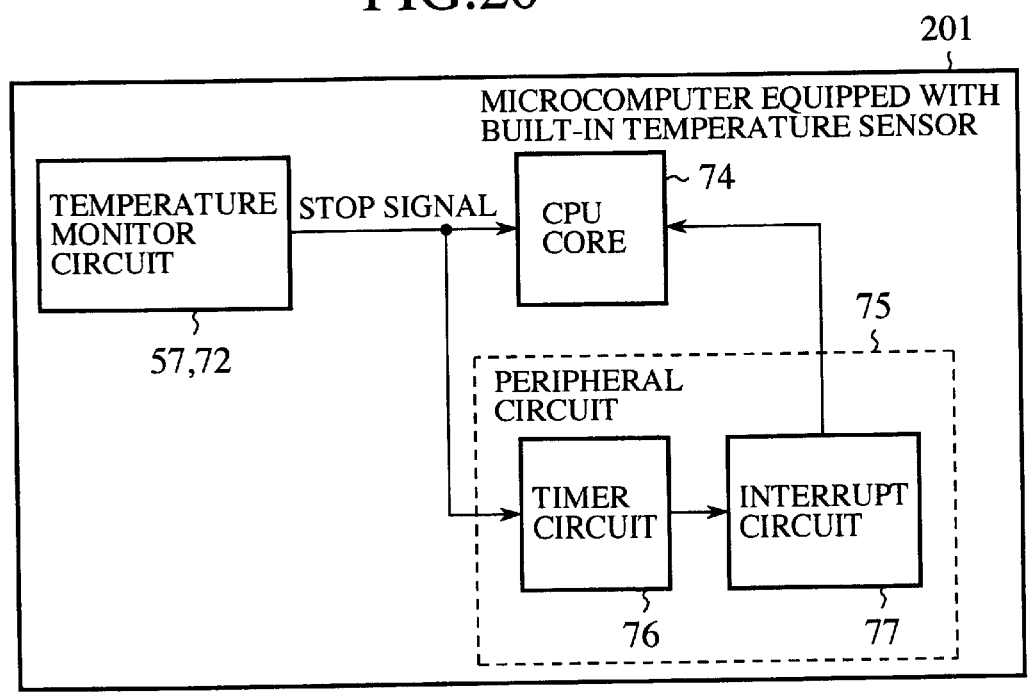
FIG. 20 is a block diagram showing a configuration of a microcomputer equipped with a built-in temperature sensor according to the fifth embodiment of the present invention.

FIG. 20 is a block diagram showing a configuration of a microcomputer equipped with a built-in temperature sensor in which the temperature monitor circuit shown in FIG. 18 or FIG. 19 is incorporated. In FIG. 20, the reference number 201 designates the microcomputer equipped with the built-in temperature sensor. The reference number 74 indicates a CPU core, 75 denotes a peripheral circuit, 76 designates a timer circuit, and 77 indicates an interrupt circuit. The temperature monitor circuit 57 or 72 outputs the stop signal to the CPU core 74 and the timer circuit 76 in the peripheral circuit 75.

When receiving the stop signal, the CPU core 74 halts the generation of the clock signal. While the generation operation of the clock signal is halted, the timer circuit 76 in the peripheral circuit 75 and the interrupt circuit 77 active in operation continuously. When receiving the stop signal from the temperature monitor circuit 57 or 72, the timer circuit 76 initiates a counting operation. After a predetermined time elapses, the timer circuit 76 generates and outputs an interrupt signal to the interrupt circuit 77. The interrupt circuit 77 initiates the interrupt operation to the CPU core 74 in order to restart the operation of the CPU core 74.

As described above in detail, when the temperature of the semiconductor chip is over the prescribed value, the temperature monitor circuit 57 or 72 outputs the stop signal to the CPU core 74, and the CPU core 74 halts the operation. After the predetermined time elapses, the CPU core 74 restarts its operation. Accordingly, even if the semiconductor chip enters a high temperature state, it is possible to prevent the occurrence of faulty operation and runaway of the microcomputer.

Figure 21:
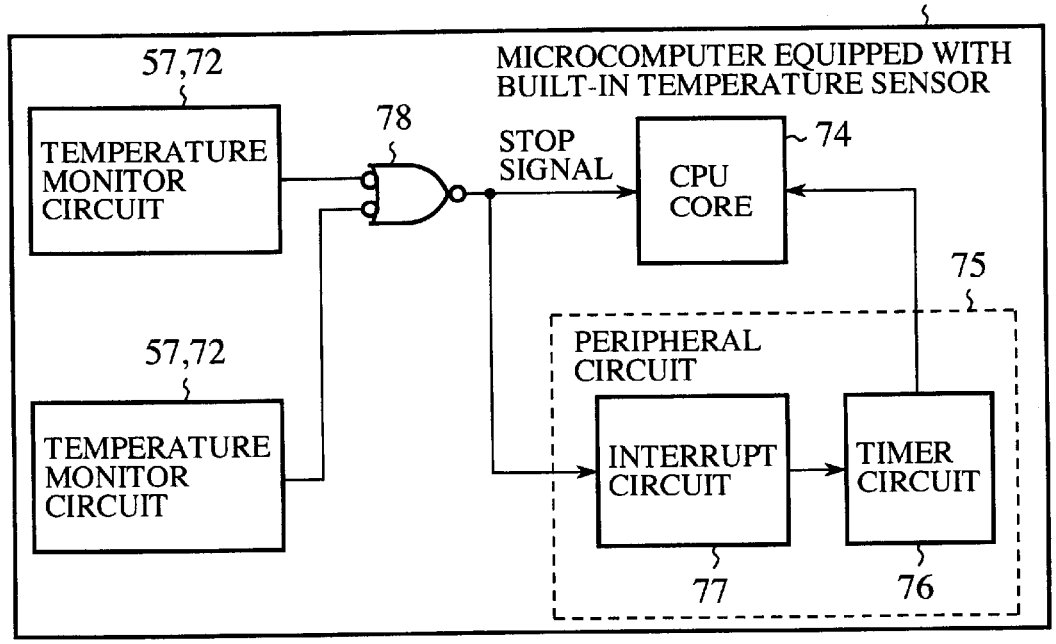
FIG. 21 is a block diagram showing another configuration of the microcomputer equipped with the built-in temperature sensor according to the fifth embodiment of the present invention.

FIG. 21 is a block diagram showing another configuration of the microcomputer 201 equipped with the built-in temperature sensor shown in FIG. 20, in which the temperature monitor circuit is incorporated in each of the circuit blocks. In FIG. 21, the reference number 78 designates a NOR gate for executing a NOR operation among the stop signals transferred from each of the temperature monitor circuits 57 (or 72) and outputs the arithmetic result as a control signal to both the CPU core 74 and the interrupt circuit 77. Since other circuit components are the same as those in the configuration shown in FIG. 20, the explanation for the same circuit components is omitted here and the same reference numbers will be used.

The NOR gate 78 performs the NOR operation among the stop signals transferred from the temperature monitor circuits 57 (or 72). For example, when the temperature of one circuit block is over the prescribed value, this monitor circuit 57 (or 72) generates and outputs the stop signal to the NOR gate 78. The clock generation operation in the microcomputer 211 can be thereby halted for a predetermined time period. Because the temperature monitor circuit 57 (or 72) is incorporated in each of the plurality of circuit blocks, it is possible to monitor the temperature at each of a plurality of areas in the semiconductor chip. By this configuration, the temperature of the semiconductor chip can be detected with a high preciously order.

Figure 22:
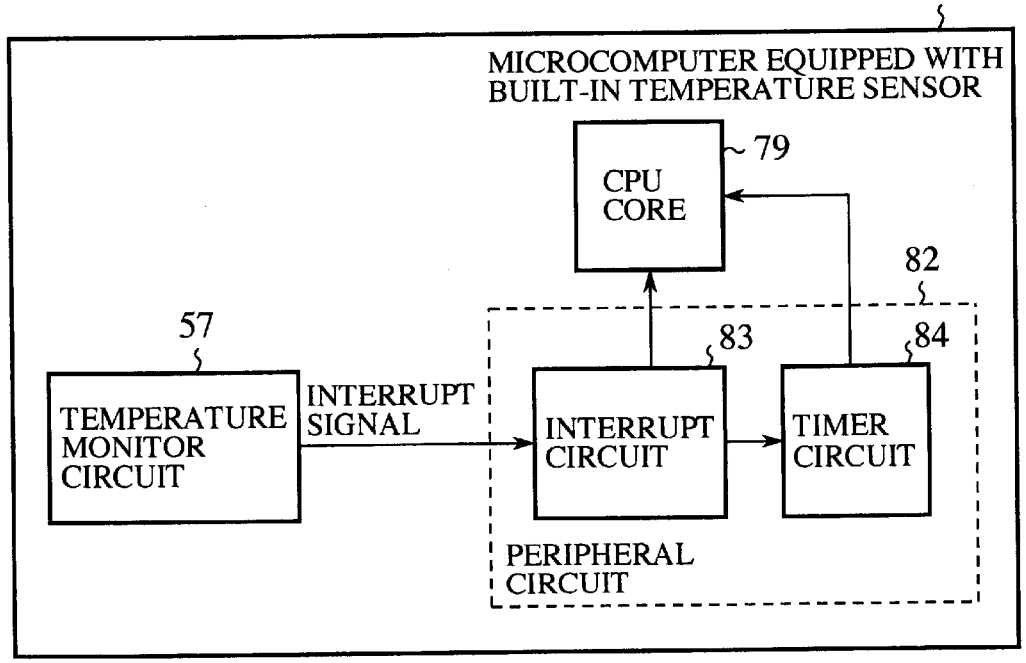
FIG. 22 is a block diagram showing another configuration of the microcomputer equipped with the built-in temperature sensor according to the fifth embodiment of the present invention;.

FIG. 22 is a block diagram showing another configuration of the microcomputer 201 shown in FIG. 20. In FIG. 22, the reference number 221 designates a semiconductor chip in which the microcomputer equipped with the built-in temperature sensor is mounted. The reference number 79 denotes a CPU core, and 82 denotes a peripheral circuit. The peripheral circuit 82 comprises an interrupt circuit 83 and a timer circuit 84. The temperature monitor circuit 57 shown in FIG. 22 corresponds to the temperature monitor circuit 57 shown in FIG. 18.

In the microcomputer 221 equipped with the built-in temperature sensor having the configuration shown in FIG. 22, the temperature monitor circuit 57 directly output a stop signal, namely an interrupt signal (as a control signal), to the interrupt circuit 83, not to the CPU core 79.

When the temperature of the semiconductor chip is over the prescribed value, the temperature monitor circuit 57 outputs directly to the interrupt circuit 83 in the peripheral circuit 82. The interrupt circuit 83 then outputs the interrupt signal to the CPU core 79. When receiving the interrupt signal from the interrupt circuit 83, the CPU core 79 halts the generation of the clock signal without delay. When the CPU core 79 halts the generation of the clock signal, the timer circuit 84 initiates the counting operation immediately. After a predetermined time elapses, the timer circuit 84 outputs a control signal to the CPU core 79. When receiving the control signal from the timer circuit 84, the CPU core 79 restarts the generation operation of the clock signal.

Figure 23:
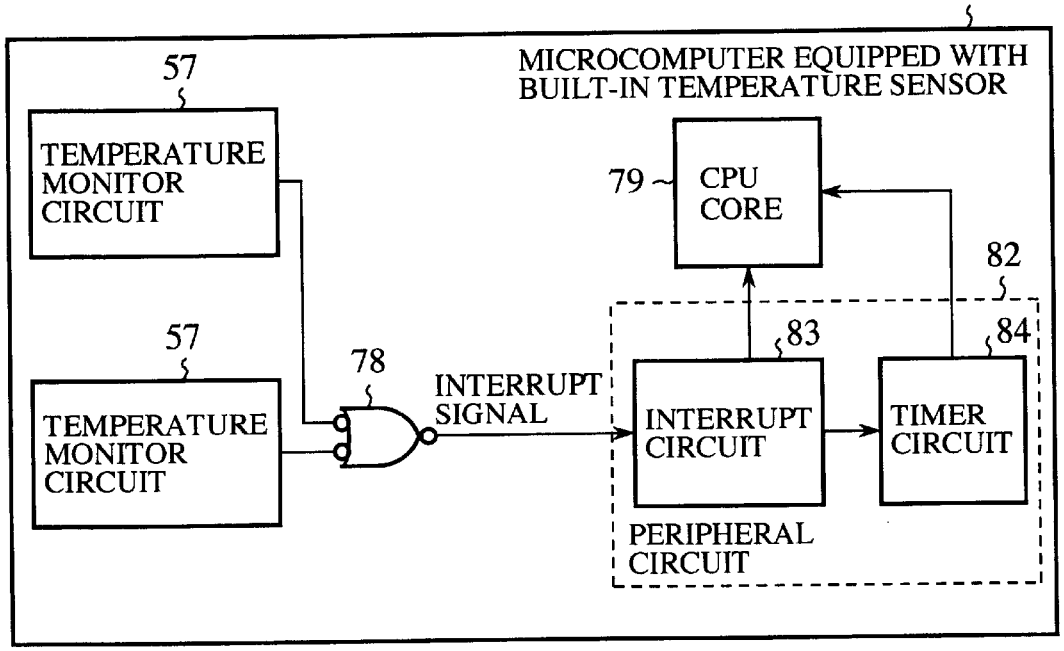
FIG. 23 is a block diagram showing another configuration of the microcomputer equipped with the built-in temperature sensor according to the fifth embodiment of the present invention.

FIG. 23 is a block diagram showing another configuration of the microcomputer 221 equipped with the built-in temperature sensor shown in FIG. 22. In the configuration shown in FIG. 23, the temperature monitor circuit 57 is incorporated in each circuit block.

The NOR gate 78 performs a NOR operation among the signals transferred from the temperature monitor circuits 57, and then outputs the arithmetic result as an interrupt signal to the interrupt circuit 83. The operation of the microcomputer 241 is the same as the operation of the case shown in FIG. 22.

Because the temperature monitor circuit 57 is incorporated in each of the plurality of the circuit blocks, it is possible to detect the temperatures at a plurality of areas in the semiconductor chip. Accordingly, even if the number of operation frequencies in the circuit blocks becomes high and/or there is one or more circuit blocks having a large heating amount on the semiconductor chip, it is possible to detect the temperature with a high precision.

Figure 24:
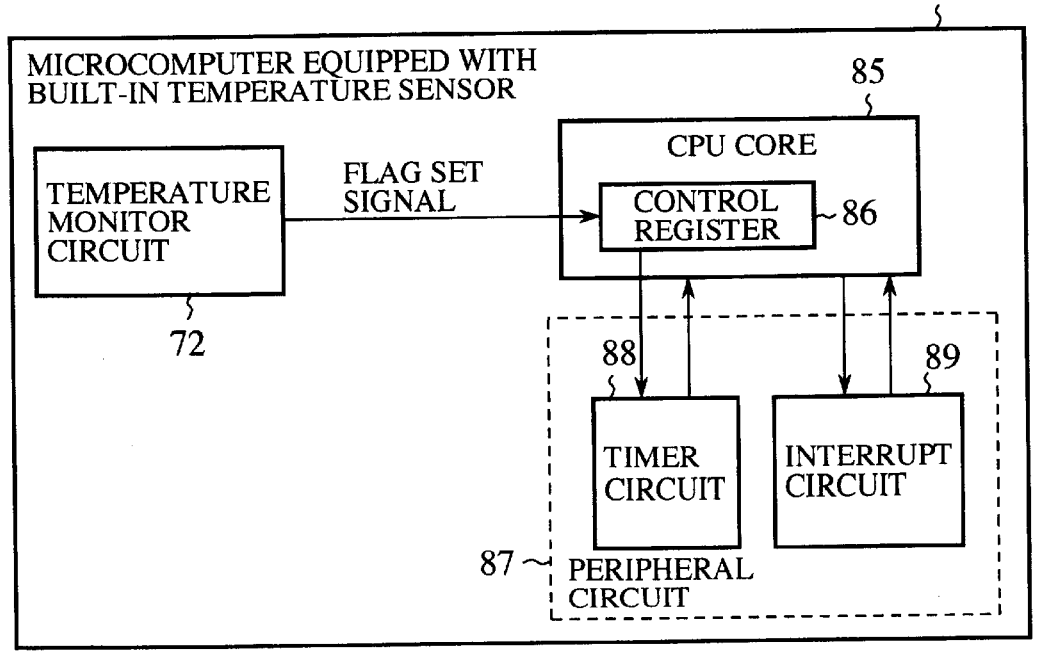
FIG. 24 is a block diagram showing another configuration of the microcomputer equipped with the built-in temperature sensor according to the fifth embodiment of the present invention.

FIG. 24 is a block diagram showing another configuration of the microcomputer 221 equipped with the built-in temperature sensor shown in FIG. 22. In FIG. 24, the reference number 241 designates the microcomputer equipped with the built-in temperature sensor, and 72 denotes the temperature monitor circuit that has been shown in FIG. 19. The reference number 85 indicates a CPU core. The CPU core 85 has a control register 86. The reference number 86 designates a peripheral circuit in which a timer circuit 88 and an interrupt circuit 89 are incorporated.

In the configuration of the microcomputer 241 equipped with the built-in temperature sensor, the temperature monitor circuit 72 outputs the signal as a flag set signal, namely a control signal, to the CPU core 85 in order to set a flag in the control register 86 in the CPU core 85. For example, when the temperature of the semiconductor chip rises over a prescribed value, the monitor circuit 72 generates and outputs the flag set signal to the CPU core 85. When receiving the flag set signal, the flag in the control register 86 is set to a desired value. Accordingly, a CPU (not shown) in the CPU core 85 executes a program to read the value of the flag in the control register 86. Thereby, when the value of the flag is equal to a predetermined value, the interrupt circuit 89 outputs an interrupt signal to the CPU (not shown). The CPU core 85 halts the generation operation of the clock signal. The timer circuit 88 initiates the counting operation simultaneously. After a prescribed time elapses, the timer circuit 88 outputs the control signal to the CPU core 85 in order to restart the generation operation of the clock signal. When receiving the control signal from the timer circuit 88, the CPU core 85 restarts the generation operation of the clock signal. When the temperature of the semiconductor chip drops under the prescribed value, the value of the flag is reset based on the flag set signal transferred from the temperature monitor circuit 72.

In the microcomputer 241 equipped with the built-in temperature sensor shown in FIG. 24, the value of the flag in the control register 86 is updated according to the flag set signal transferred from the temperature monitor circuit 72, and the program monitors the value of the flag in the control register 86 at every time. It is therefore possible to monitor the temperature of the semiconductor chip.

Figure 25:
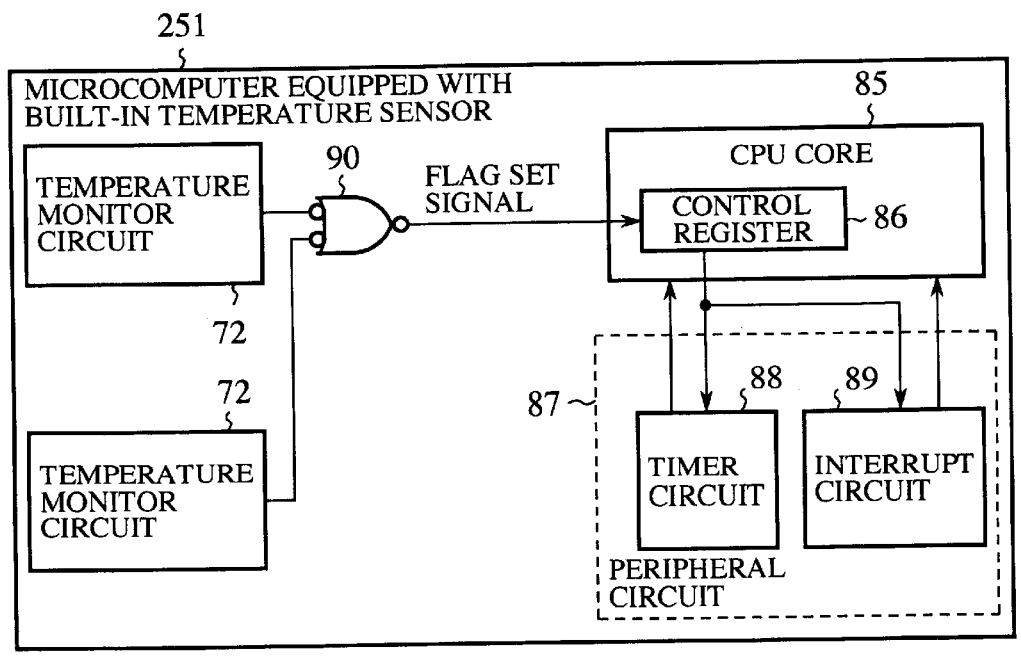
FIG. 25 is a block diagram showing another configuration of the microcomputer equipped with the built-in temperature sensor according to the fifth embodiment of the present invention.

FIG. 25 is a block diagram showing another configuration of the microcomputer 241 equipped with the built-in temperature sensor shown in FIG. 24. In FIG. 25, the reference number 251 designates the microcomputer equipped with the built-in temperature sensor, and 90 denotes a NOR gate for executing a NOR operation among the flag set signals (as control signals) transferred from the temperature monitor circuits 72. Each temperature monitor circuit 72 is incorporated in each circuit block. The NOR gate 90 then outputs the arithmetic result to the CPU core 85. Other circuit components in the microcomputer 241 are the same as those in the microcomputer 241 shown in FIG. 24, the explanation for the same circuit components is omitted here, and the same reference numbers will be used.

In the microcomputer 251 having the configuration shown in FIG. 25, the temperature monitor circuit 72 is incorporated in each of the plurality of circuit blocks. In particularly, it is possible to detect the temperature of the circuit block having a large operation frequencies with a high precision.

Figure 26:
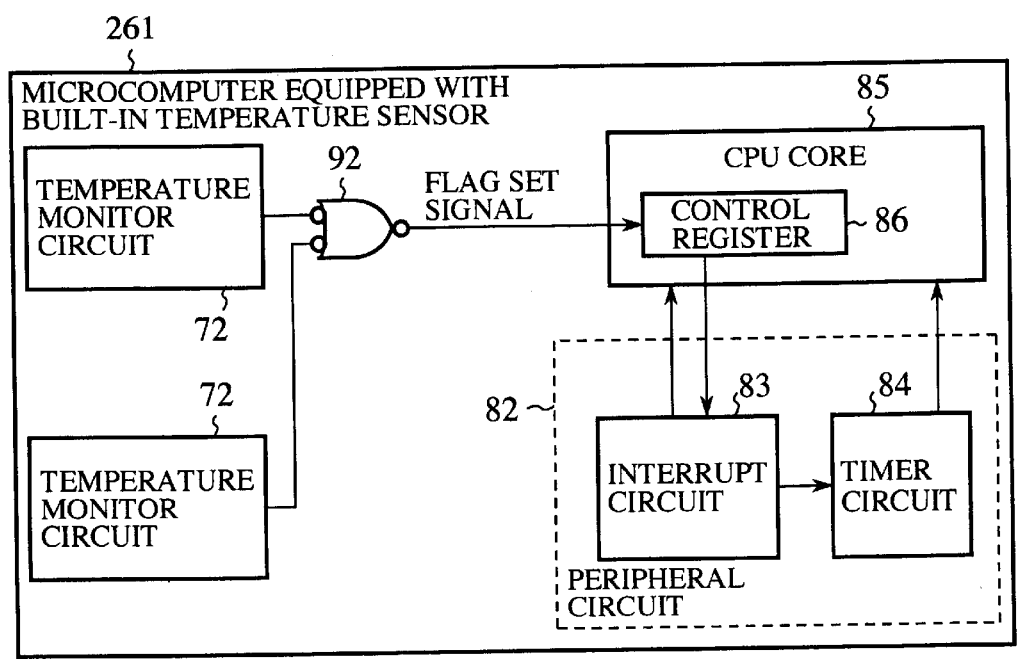
FIG. 26 is a block diagram showing another configuration of the microcomputer equipped with the built-in temperature sensor according to the fifth embodiment of the present invention.

FIG. 26 is a block diagram showing another configuration of the microcomputer 231 shown in FIG. 23. In FIG. 26, the reference number 261 designates the microcomputer equipped with the built-in temperature sensor, and 85 denotes a CPU core in which a control register 86 is incorporated. The reference number 92 designates a NOR gate for inputting the flag set signals output from a plurality of temperature monitor circuits 72, and executes a NOR operation, and then outputting an arithmetic result as a flag set signal to the CPU core 85. Other circuit components in the microcomputer 261 are the same as those in the microcomputer 231 shown in FIG. 23, the explanation for the same circuit components is omitted here, and the same reference numbers will be used.

In the configuration of the microcomputer shown in FIG. 26, the value of the flag stored in the control register .86 is set based on the flag set signal output from the NOR gate 92. The interrupt circuit 83 initiates an interrupt operation according to the value of the flag in the control register 86, and the timer circuit 84 also initiates the counting operation simultaneously. The interrupt circuit 83 transfers to the CPU core 85 the instruction to halt the generation operation of the clock signal for a predetermined time period. The timer circuit 84 initiates the counting operation immediately. After the predetermined time elapses, the timer circuit 84 transfers to the CPU core 85 the instruction to restart the generation operation of the clock signal. Thereby, the CPU core 85 restarts the generation operation of the clock signal.

For example, the temperature of one of the plurality of circuit blocks is over the prescribed value, the temperature monitor circuit 72 incorporated in this circuit block outputs the flag set signal to the NOR gate 92. The NOR gate then outputs the flag set signal to the control register 86. By setting the value of the flag in the control register based on the flag set signal, it is possible to indicate to initiate the interrupt operation and the counting operation to the interrupt circuit 83 and the timer circuit 84, respectively.

In the microcomputer 261 having the configuration shown in FIG. 26, the temperature monitor circuit 72 is incorporated in each of the plurality of circuit blocks. In particularly, it is possible to detect the temperature of the circuit block in which many operation frequencies occur with a high precision.

As described above, according to the fifth embodiment, the interrupt circuit performs the interrupt operation based on the stop signal or the interrupt signal output from the temperature monitor circuit. Thereby, the CPU core halts the generation of the clock signal, temporarily, and the CPU core restarts the generation operation of the clock signal when the count value of the timer circuit is reached to the predetermined value. Accordingly, even if the temperature of the semiconductor chip rises over the prescribed value, it is possible to prevent the occurrence of faulty operation or runaway of the microcomputer.

Sixth Embodiment

Figure 27:
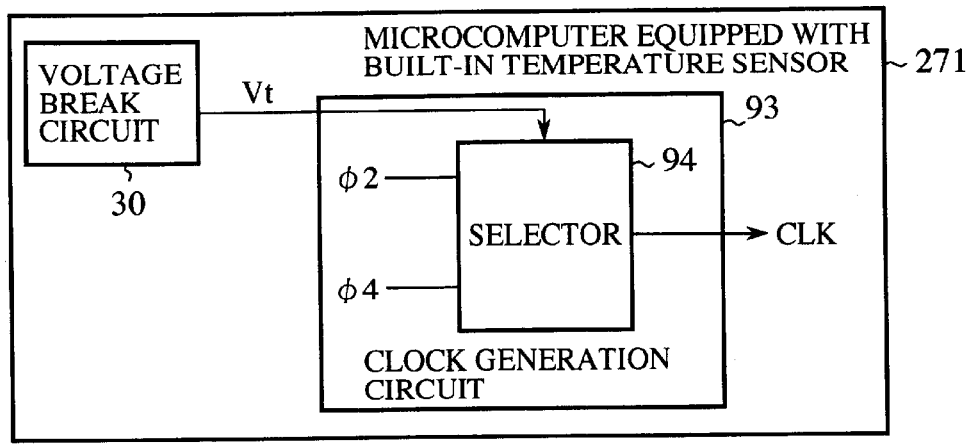
FIG. 27 is a block diagram showing a configuration of a microcomputer equipped with a built-in temperature sensor according to the sixth embodiment of the present invention.

FIG. 27 is a block diagram showing a configuration of a microcomputer equipped with a built-in temperature sensor according to the sixth embodiment of the present invention. In FIG. 27, the reference number 271 designates the microcomputer equipped with the built-in temperature sensor. The reference number 30 denotes a voltage break circuit which corresponds to the voltage break circuit 30 shown in FIG. 8, for example.

The reference number 93 designates a clock generation circuit, 94 indicates a selector incorporated in the clock generation circuit 93. The selector 94 inputs a control voltage signal Vt and a plurality of operational clocks φ2 and φ4 whose frequencies are different to each other, and then selects one of the operational clocks according to the control voltage signal Vt, and finally outputs the clock signal CLK having the selected operational frequency Next, a description will be given of the operation of the microcomputer according to the sixth embodiment.

For example, when the temperature of the semiconductor chip rises over a prescribed value, the voltage break circuit 30 outputs the control voltage signal of the L level. When receiving the control voltage signal Vt of the L level, the selector 94 in the clock generation circuit 93 switches the frequency of the operational clock from the frequency φ2 to the frequency φ4. The selectors then outputs the clock signal CLK of the frequency φ4 whose frequency is lower than the frequency φ2.

After this, when the temperature of the semiconductor chip drops under the prescribed value, the voltage break circuit 30 outputs the control voltage signal Vt of the L level again, and the clock generation circuit 93 outputs the clock signal CLK having the higher frequency φ2.

In the microcomputer 271 shown in FIG. 27, because the clock generation circuit 93 switches the frequency of the clock signal CLK based on the control voltage signal Vt output from the voltage break circuit 30, it is possible to prevent the occurrence of faulty operation or runaway of the microcomputer 271.

Figure 28:
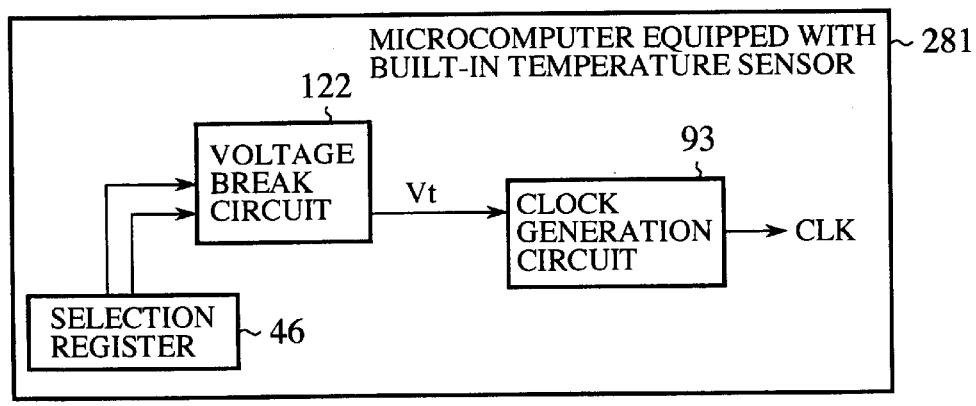
FIG. 28 is a block diagram showing another configuration of the microcomputer equipped with the built-in temperature sensor according to the sixth embodiment of the present invention.

FIG. 28 is a block diagram showing another configuration of the microcomputer 271 equipped with the built-in temperature sensor shown in FIG. 27. In FIG. 28, the reference number 122 designates a voltage break circuit, and 46 denotes a selection register. The configuration and the operation of the voltage break circuit 122 and the selection circuit 46 is the same as those in the configuration shown in FIG. 12. The reference number 93 designates a clock generation circuit whose configuration and the operation are the same as those in the configuration shown in FIG. 27. The reference number 281 designates the microcomputer equipped with the built-in temperature sensor.

Thus, even if the microcomputer has the configuration of the voltage break circuit 122 and the configuration of the selection register 46 shown in FIG. 12, the clock generation circuit 93 can switch the frequency of the clock signal CLK based on the control voltage signal Vt output from the voltage break circuit 122. It is thereby possible to prevent the occurrence of faulty operation or runaway of the microcomputer 271.

Figure 29:
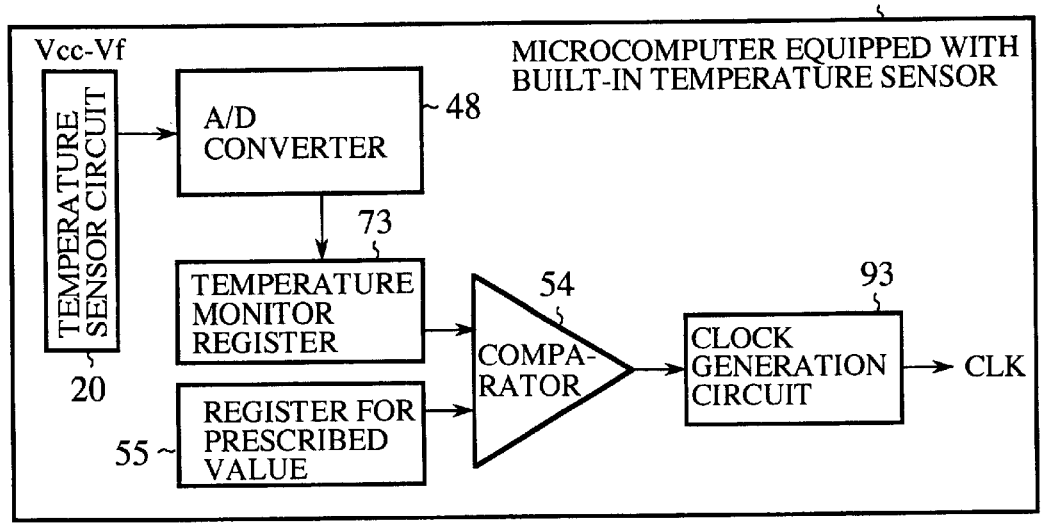
FIG. 29 is a block diagram showing another configuration of the microcomputer equipped with the built-in temperature sensor according to the sixth embodiment of the present invention.

FIG. 29 is a block diagram showing another configuration of the microcomputer 271 equipped with the built-in temperature sensor shown in FIG. 27. In FIG. 29, the reference number 20 designates a temperature sensor circuit, 48 denotes a A/D converter, 73 indicates a temperature monitor register, 55 designates a register for storing a prescribed value, and 54 denotes a comparator. The configuration and the operation of these circuit components 20, 48, 73, 54, and 55 are the same as those in the microcomputer shown in FIG. 19. The reference number 93 designates a clock generation circuit whose configuration and operation are the same as those in the microcomputer shown in FIG. 27. The reference number 291 designates the microcomputer equipped with the built-in temperature sensor.

In the microcomputer 291, because the clock generation circuit 93 switches the frequency of the clock signal CLK based on the stop signal output from the comparator 54, it is possible to prevent the occurrence of faulty operation or runaway of the microcomputer 271.

Figure 30:
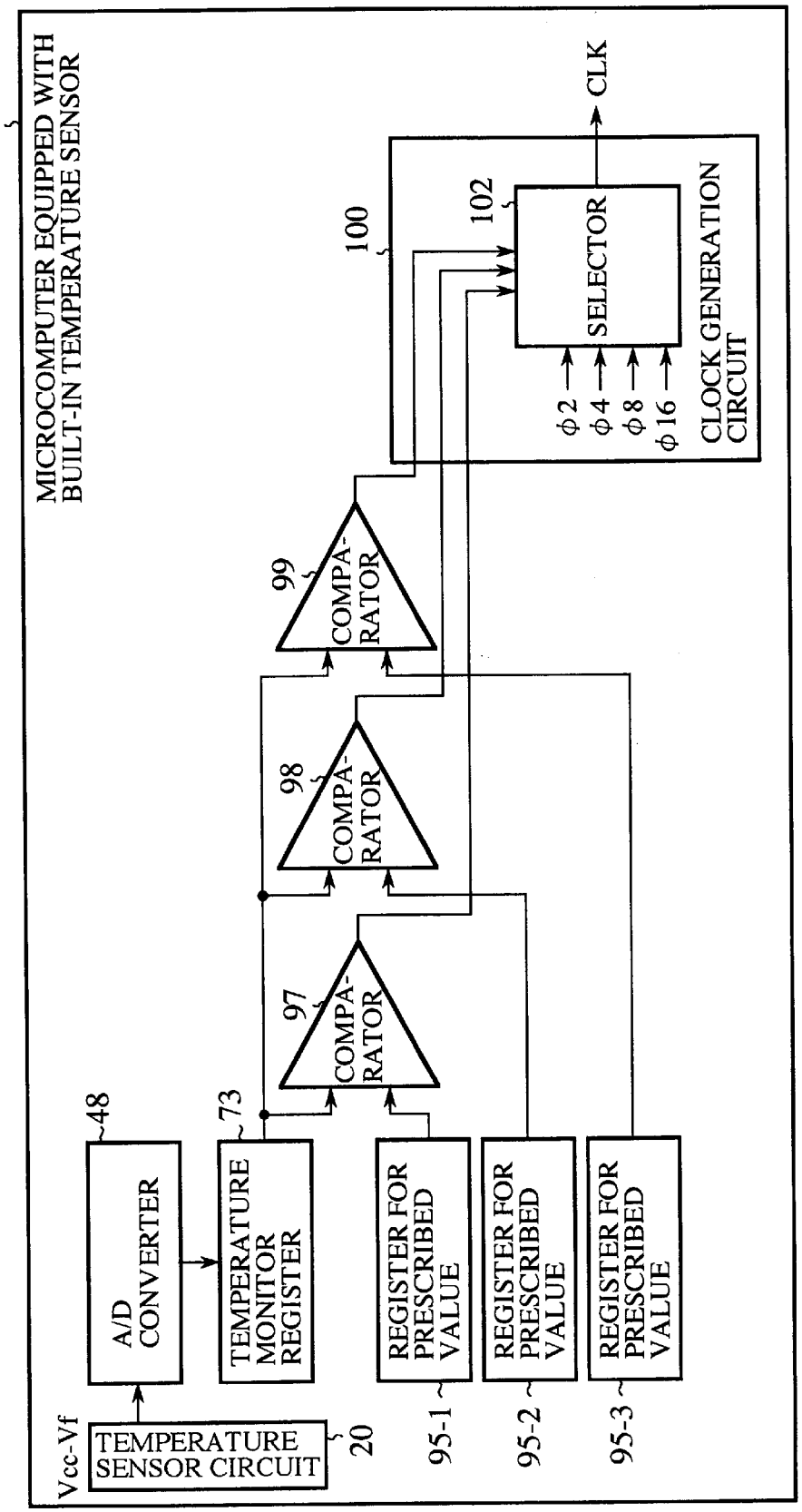
FIG. 30 is a block diagram showing another configuration of the microcomputer equipped with the built-in temperature sensor according to the sixth embodiment of the present invention.

FIG. 30 is a block diagram showing another configuration of the microcomputer 291 equipped with the built-in temperature sensor shown in FIG. 29. In FIG. 30, the reference number 20 designates a temperature sensor circuit, 48 denotes an A/D converter, and 73 indicates a temperature monitor register. The configuration and operation of these circuit components 20, 48, and 73 are the same as those in the microcomputer shown in FIG. 12. The reference numbers 95-1, 95-2, and 95-3 denote registers for prescribed values. The reference number 100 designates a clock generation circuit. The reference number 102 designates a selector for inputting control signals output from the comparators 97, 98, and 99 and a plurality of operational clocks having different frequencies φ2, φ4, φ8, and φ16, and then outputting a clock signal CLK having the frequency selected. The reference number 301 designates the microcomputer equipped with the built-in temperature sensor.

In the microcomputer 301 equipped with the built-in temperature sensor shown in FIG. 30, the registers 95-1, 95-2, and 95-3 store the prescribed values of different digital voltages which correspond to different temperature ranges, respectively. For example, the register 95-1 stores the digital voltage value "001" corresponding to the temperature range of the semiconductor chip of 30° C. to 60° C., the register 95-2 stores the digital voltage value "011" corresponding to the temperature range of the semiconductor chip of 60° C. to 90° C., and the register 95-3 stores the digital voltage value "111" corresponding to the temperature range of the semiconductor chip over 90° C. In addition, the temperature monitor register 73 stores digital voltage value output from the A/D converter 48. The comparators 97, 98, and 99 compare the values stored in the registers 95-1, 95-2, and 95-3 with the value stored in the temperature monitor register 73, respectively, and then output the comparison results to the clock generation circuit 100. The selector 102 in the clock signal generator 100 selects one of the clock frequencies φ2, φ4, φ8, and φ16 based on the comparison results, and then outputs a clock signal CLK having the selected frequency to external devices of the clock generation circuit 100 such as a CPU.

Because the clock generation circuit 100 switches the frequency of the clock signal CLK stepwise based on the comparison results output from the comparators 97, 98, and 99 according to the temperature of the semiconductor chip, it is possible to control preciously the operation of the microcomputer according to applications. In addition, it is thereby possible to prevent the occurrence of faulty operation and runaway of the microcomputer.

As described above, according to the sixth embodiment, the microcomputer has the configuration in which one of the frequencies having different frequencies is selected based on the comparison results obtained by comparing the control signal from the voltage break circuit or the digital voltage value from the A/D converter with the prescribed value or a plurality of prescribed values. It is thereby possible to prevent the occurrence of faulty operation and runaway of the microcomputer, even if the temperature of the semiconductor chip increases over the prescribed value.

Seventh Embodiment

Figure 31:
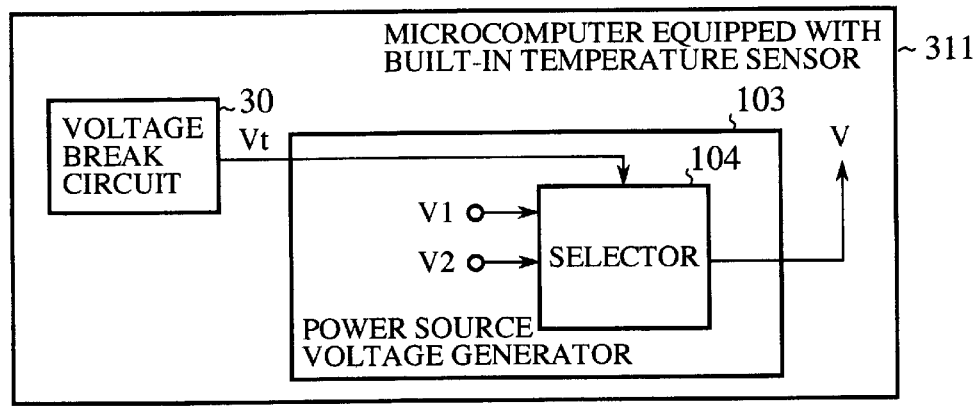
FIG. 31 is a block diagram showing a configuration of a microcomputer equipped with a built-in temperature sensor according to the seventh embodiment of the present invention.

FIG. 31 is a block diagram showing a configuration of a microcomputer equipped with a built-in temperature sensor according to the seventh embodiment of the present invention. In FIG. 31, the reference number 30 designates a voltage break circuit which corresponds to the voltage break circuit 30 shown in FIG. 8. The reference number 103 denotes a power source generation circuit in which a selector 104 is incorporated. The selector 104 in the power source generation circuit 103 selects and outputs one of voltages V1 and V2 based on the level of the control voltage signal Vt output from the voltage break circuit 30. The reference number 311 indicates the microcomputer equipped with the built-in temperature sensor.

Next, a description will be given of the operation of the microcomputer according to the seventh embodiment.

In general, when the temperature of the semiconductor chip on which the microcomputer 311 is mounted rises, the driving ability of the microcomputer 311 drops. This causes to decrease the operation speed of the microcomputer 311.

When the temperature of the semiconductor chip is over the prescribed value, the voltage break circuit 30 in the microcomputer 311 shown in FIG. 31 outputs the voltage control signal of the L level to the power source voltage generator 103. Because the operation of the voltage break circuit 30 is the same as that of the voltage break circuit 30 shown in FIG. 8, the explanation of the operation is omitted here.

When receiving the control voltage signal Vt of the L level output from the voltage break circuit 30, the selector 104 selects and outputs the higher power source voltage V2 (>V1). Thereby, the driving ability in the microcomputer 311 becomes greater, and it is possible to prevent the occurrence of faulty operation and runaway of the microcomputer 311.

Figure 32:
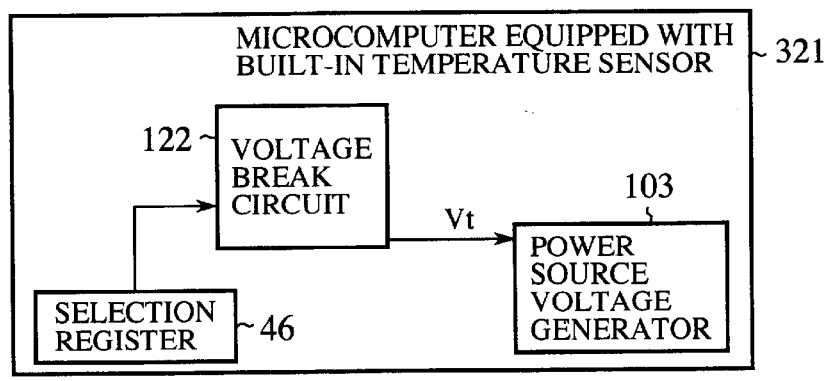
FIG. 32 is a block diagram showing another configuration of the microcomputer equipped with the built-in temperature sensor according to the seventh embodiment of the present invention.

FIG. 32 is a block diagram showing another configuration of the microcomputer 311 equipped with the built-in temperature sensor shown in FIG. 31. In FIG. 32, the reference number 122 designates a voltage break circuit , and 46 denotes a selection register. The configuration and the operation of the voltage break circuit 122 and the selection register 46 are the same as those shown in FIG. 12. The reference number 103 designates a power source voltage generation circuit, whose configuration and the operation is the same as that shown in FIG. 31. The reference number 321 designates the microcomputer equipped with the built-in temperature sensor.

Thus, in the configuration where the voltage break circuit 122 and the selection register 46 shown in FIG. 12 are incorporated in the microcomputer 321, the power source voltage generation circuit 103 can switch the power source voltage based on the control voltage signal Vt output from the voltage break circuit 122. It is therefore possible to prevent the occurrence of faulty operation and runaway of the microcomputer 321.

Figure 33:
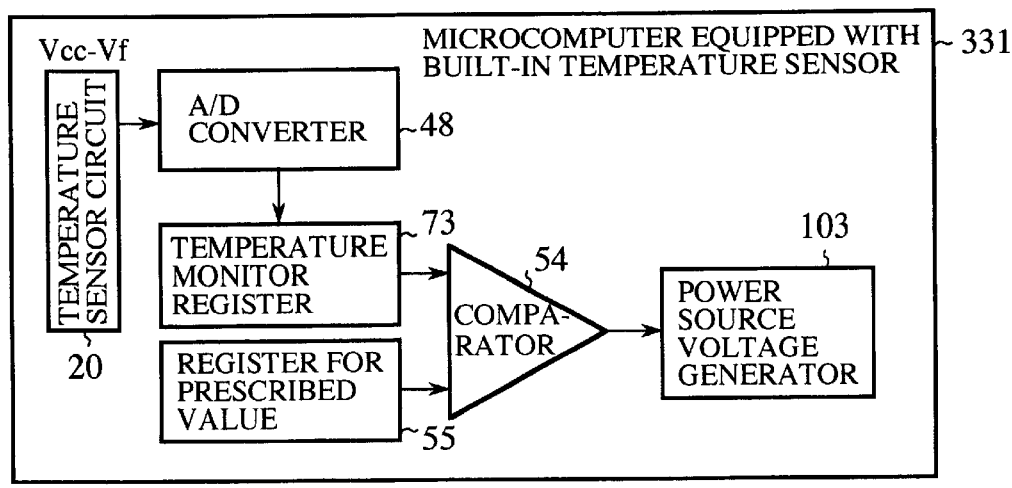
FIG. 33 is a block diagram showing another configuration of the microcomputer equipped with the built-in temperature sensor according to the seventh embodiment of the present invention.

FIG. 33 is a block diagram showing another configuration of the microcomputer 311 equipped with the built-in temperature sensor shown in FIG. 31. In FIG. 33, the reference number 20 designates a temperature sensor circuit, 48 denotes an A/D converter, 73 indicates a temperature monitor register, 55 designates a register for storing a prescribed value, and 54 denotes a comparator. The configuration and the operation of the circuit components 20, 48, 73, 54, and 55 are the same as those shown in FIG. 19. The reference number 103 designates a power source voltage generation circuit whose configuration and the operation are the same as those shown in FIG. 32. Accordingly, the explanation for them is omitted here.

As shown in FIG. 33, the power source voltage generation circuit 103 switches and outputs the power source voltage based on the comparison result from the comparator 54. For example, when the temperature of the semiconductor chip rises over a prescribed value, the comparator 54 outputs the control signal of the L level to the power source voltage generation circuit 103. The selector 104 in the power source voltage generation circuit 103 selects and outputs a higher power source voltage V2 (>V1). Similar to the cases shown in FIG. 31 and FIG. 32, it is therefore possible to prevent the occurrence of faulty operation and runaway of the microcomputer 331.

Figure 34:
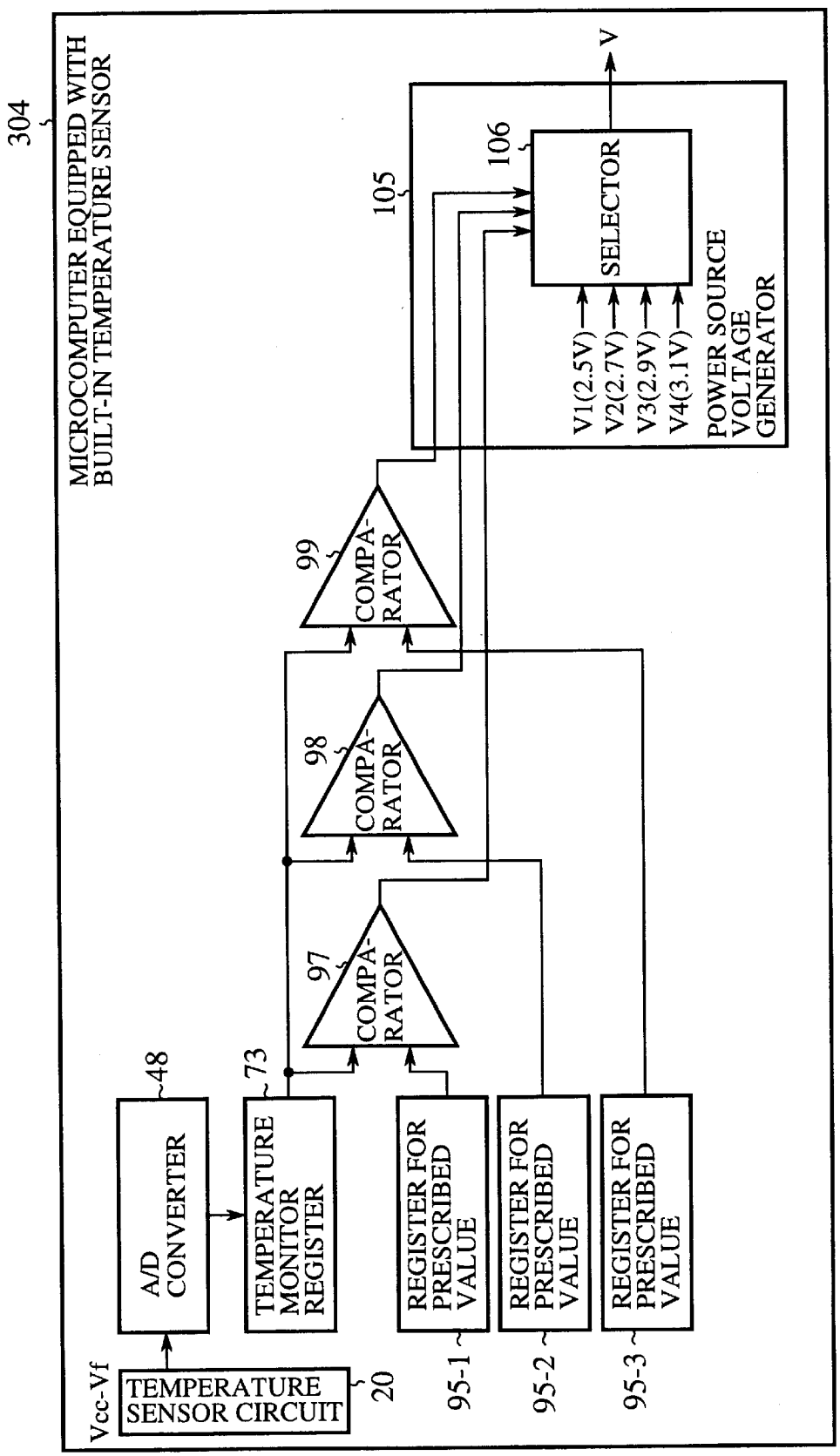
FIG. 34 is a block diagram showing another configuration of the microcomputer equipped with the built-in temperature sensor according to the seventh embodiment of the present invention.

FIG. 34 is a block diagram showing another configuration of the microcomputer 331 equipped with the built-in temperature sensor shown in FIG. 33. In FIG. 34, the reference number 20 designates a temperature sensor circuit, 48 denotes an A/D converter, 73 indicates a temperature monitor register, 95-1, 95-2, and 95-3 denote registers for storing prescribed values, and 97, 98, and 99 indicate comparators. The reference number 105 designates a power source voltage generation circuit in which a selector 106 is incorporated. The selector 106 inputs the control signals from the comparators 97, 98, and 99 and the voltages V1, V2, V3, and V4, and selects and outputs one of the voltages V1, V2, V3, and V4. The reference number 341 designates the microcomputer 341 equipped with the built-in temperature sensor.

In the configuration of the microcomputer 341 equipped with the built-in temperature sensor shown in FIG. 34, the power source voltage generation circuit 105 is incorporated instead of the clock generation circuit 100 in the microcomputer 301 equipped with the built-in temperature sensor shown in FIG. 30. The operations of the circuit components other than the power source voltage generation circuit 105 are the same as those in the configuration shown in FIG. 30.

In the microcomputer 341 equipped with the built-in temperature sensor shown in FIG. 34, the different prescribed values are stored in the registers 95-1, 95-2, and 95-3, respectively. For example, the register 95-1 stores the digital voltage value "001" corresponding to the temperature range of the semiconductor chip of 30° C. to 60° C., the register 95-2 stores the digital voltage value "011" corresponding to the temperature range of the semiconductor chip of 60° C. to 90° C., and the register 95-3 stores the digital voltage value "111" corresponding to the temperature range of the semiconductor chip over 90° C. The comparators 97, 98, and 99 compare the values stored in the registers 95-1, 95-2, and 95-3 with the digital voltage value indicating the temperature of the semiconductor chip output from the A/D converter 48, and then output the comparison results. The selector 105 in the power source voltage generation circuit 105 selects one of the voltages based on the comparison results from the comparators 97, 98, and 99, and outputs the selected voltage to various circuits in the microcomputer 341.

Thus, based on the comparison results from the comparators 97, 98, and 99, namely, according to the temperature of the semiconductor chip, the power source voltage generation circuit 105 switches the level of the voltage stepwise. It is therefore possible to prevent the occurrence of fault operation and runaway of the microcomputer 341.

As described above, according to the seventh embodiment, the microcomputer is so formed that one of a plurality of voltages of different voltage levels is selected based on the comparison results obtained by comparing the control voltage signal from the voltage break circuit or the digital voltage value from the A/D converter with the prescribed values. It is therefore possible to prevent the occurrence of faulty operation and runaway of the microcomputer, even if the temperature of the semiconductor chip rises over the prescribed value.

Eighth Embodiment

Figure 35:
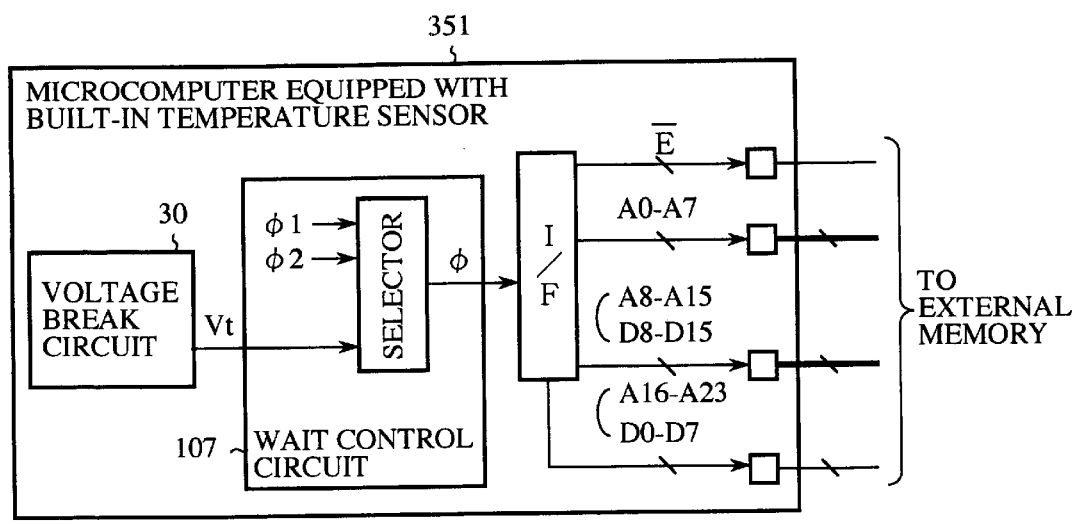
FIG. 35 is a block diagram showing a configuration of a microcomputer equipped with a built-in temperature sensor according to the eighth embodiment of the present invention.

FIG. 35 is a block diagram showing a configuration of a microcomputer equipped with a built-in temperature sensor according to the eighth embodiment of the present invention. In FIG. 35, the reference number 30 designates a voltage break circuit which corresponds to the voltage break circuit 30 shown in FIG. 8, for example. The reference number 107 designates a wait control circuit for controlling the access speed to an external memory so that the access speed becomes low. The wait control circuit 107 has a selector which inputs a control voltage signal Vt from the voltage break circuit 30 and clock signals φ1 and φ2 having different bus cycles, selects one of the cock signals based on the control voltage signal Vt, and outputs the selected one as a clock signal φ to an interface I/F the reference number 351 designates the microcomputer equipped with the built-in temperature sensor.

Next, a description will be given of the operation of the microcomputer 351 according to the eighth embodiment.

Figure 36:
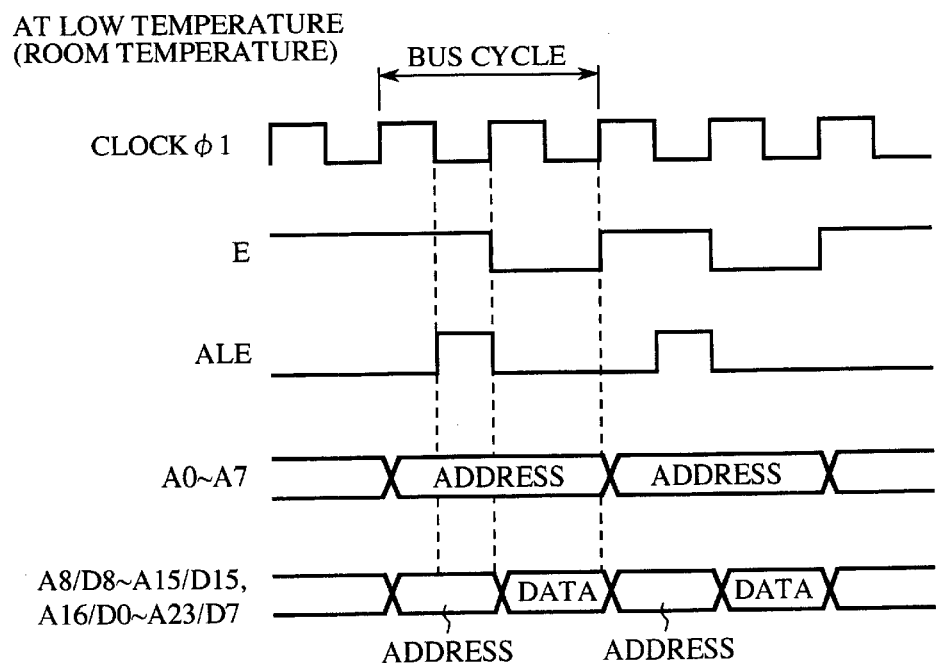
FIG. 36 is a timing chart showing the operation of the microcomputer equipped with the built-in temperature sensor according to the eighth embodiment of the present invention.
Figure 37:
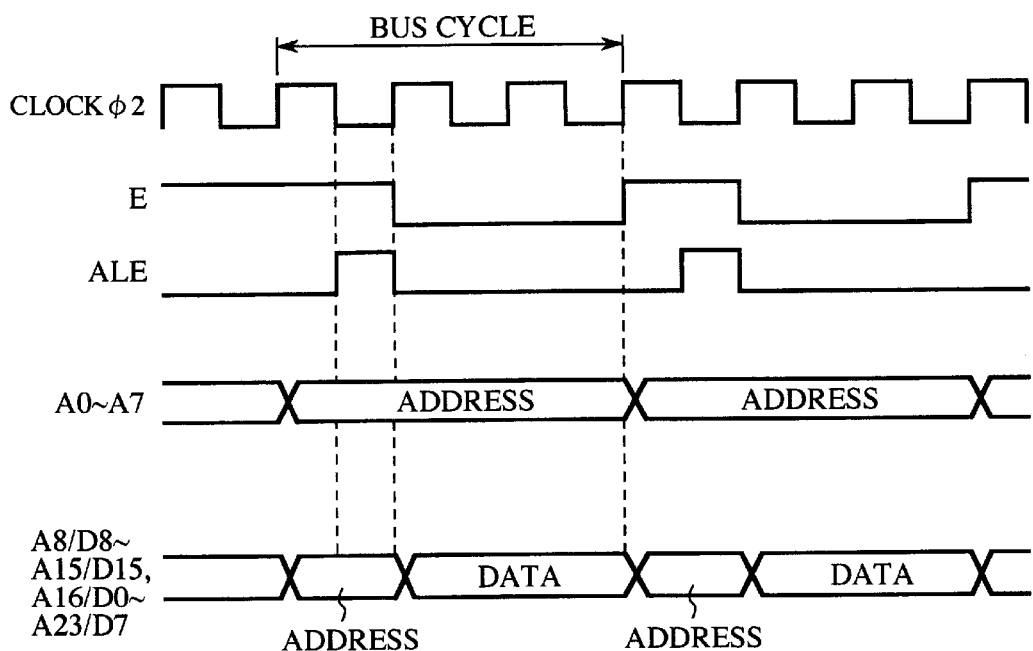
FIG. 37 is a timing chart showing the operation of the microcomputer equipped with the built-in temperature sensor according to the eighth embodiment of the present invention.

FIG. 36 and FIG. 37 are timing charts showing the access operation from the microcomputer 351 to the external memory (not shown). FIG. 36 and FIG. 37 show the timings of address signals A0 to A7, address signals and data signals A8/D8 to A15/D15, and A16/D0 to A23/D7 that are output to an external memory (not shown) through the interface I/F.

For example, when the temperature of the semiconductor chip rises over a prescribed value, the temperature sensor circuit 20 in the voltage break circuit 30 outputs the control voltage signal Vt of the L level. When receiving the control voltage signal Vt, the selector 107 in the wait control circuit 107 selects the clock signal φ2 whose bus cycle is longer than the bus cycle of the clock signal φ1, and then outputs the address signals and data signals to the interface I/F based on the selected clock signal.

The interface I/F outputs the address signals A0 to A7, the address signals and data signals A8/D8 to A15/D15, and A16/D0 to A23/D7 to the external memory (not shown) according to the timing of the selected clock signal φ2.

After this, when the temperature of the semiconductor chip drops under the prescribed value, the voltage break circuit 30 outputs the control voltage signal Vt of the H level, and the selector in the wait control circuit 107 selects and outputs the clock signal φ1 of a normal bus cycle.

Thereby, the interface I/F outputs the address signals A0 to A7, the address signals and data signals A8/D8 to A15/D15, and A16/D0 to A23/D7 to the external memory (not shown) according to the timing of the clock signal φ1.

As described above, even if the temperature of the semiconductor chip rises over the prescribed value and the operation speed of the microcomputer drops, the wait control circuit 107 so controls that the bus cycle of the clock signal to access the external memory and other devices becomes long. It is therefore possible to prevent the occurrence of faulty operation during the access to the external memory.

Figure 38:
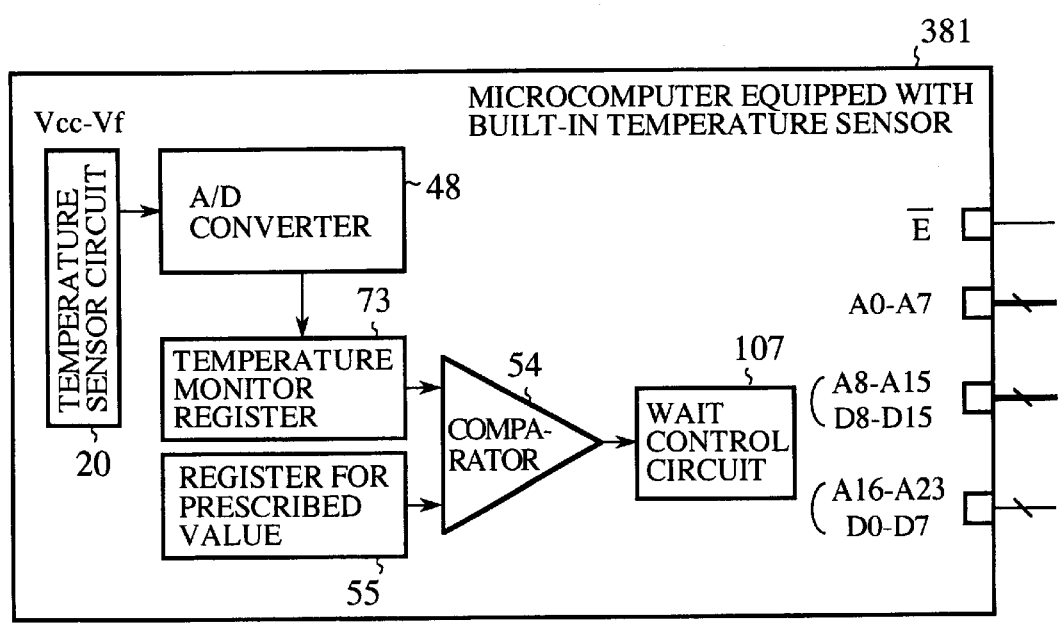
FIG. 38 is a block diagram showing another configuration of the microcomputer equipped with the built-in temperature sensor according to the eighth embodiment of the present invention.

FIG. 38 is a block diagram showing another configuration of the microcomputer 351 equipped with the built-in temperature sensor shown in FIG. 35. In FIG. 38, the reference number 20 designates a temperature sensor circuit, 48 denotes an A/D converter, 73 indicates a temperature monitor register, 55 designates a register for storing a prescribed value, and 54 designates a comparator. The configuration and operation of the circuit components 20, 48, 73, 54, and 55 are the same as those in the configuration shown in FIG. 19. The explanation for the same circuit components 20, 48, 73, 54, and 55 is therefore omitted here. The reference number 381 designates the microcomputer equipped with the built-in temperature sensor.

The wait control circuit 107 switches the bus cycle of the clock signal φ according to the control signal transferred from the comparator 54. For example, when the temperature of the semiconductor chip rises over the prescribed value, the comparator 54 outputs the control signal of the L level, and then the wait control circuit 107 outputs the clock signal φ2 of a longer bus cycle. Thereby, the microcomputer 381 can access the external memory and other devices (not shown) through the interface I/F with sufficient access time, so that it is possible to prevent the occurrence of faulty operation and runaway of the microcomputer 381.

As described above, according to the eighth embodiment, the microcomputer is so formed that the wait control circuit selects one of the plurality of clock signal having different bus cycles according to the comparison result obtained by comparing the control voltage signal from the voltage break circuit or the digital voltage value from the A/D converter with the prescribed value, and the wait control circuit then outputs the selected clock signal to the internal devices of the microcomputer 391 and external devices such as the external memory. It is therefore possible to prevent the occurrence of faulty operation and runaway of the microcomputer, even if the temperature of the microcomputer rises over the prescribed value.

Ninth Embodiment

Figure 39:
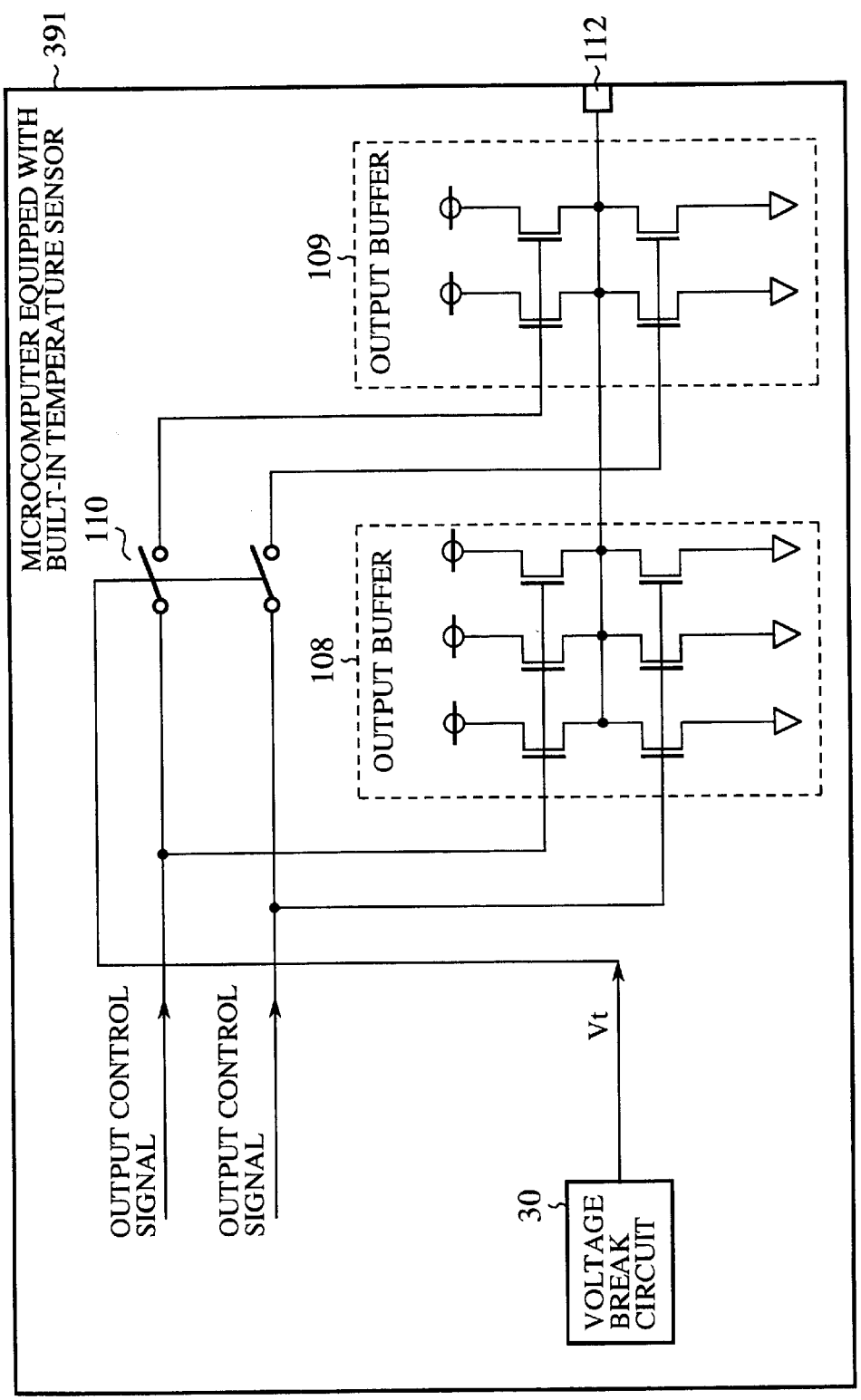
FIG. 39 is a block diagram showing a configuration of a microcomputer equipped with a built-in temperature sensor according to the ninth embodiment of the present invention.

FIG. 39 is a block diagram showing a configuration of a microcomputer equipped with a built-in temperature sensor according to the ninth embodiment of the present invention. In FIG. 39, the reference number 30 designates a voltage break circuit which corresponds to the voltage break circuit 30 shown in FIG. 8. The reference numbers 108 and 109 denote output buffers. The reference number 110 indicates a switch for selecting one of the output buffers 108 and 109, 112 designates an output terminal, and 391 denote the microcomputer equipped with the built-in temperature sensor.

Next, a description will be given of the operation of the microcomputer according to the ninth embodiment.

For example, when the temperature of the semiconductor chip rises over the prescribed value, like the case shown in FIG. 8, the temperature sensor circuit 20 in the voltage break circuit 30 operates to output the control voltage signal Vt of the L level. When receiving the control voltage signal Vt, the switch 110 selects both the output buffers 108 and 109. In this situation, when a control means such as a CPU (not shown) outputs the output control signal to the output buffers 108 and 109, both the output buffers 108 and .109 operate. This means that a driver size, namely a driving ability, becomes large.

After this, when the temperature of the semiconductor chip drops under the prescribed value, the voltage break circuit 30 outputs the control voltage signal Vt of the H level, and thereby the switch 110 selects one of the output buffers 108 and 109, so that the total driving ability of the output buffers goes back to the normal driving ability.

As written above, even if the temperature of the semiconductor chip rises over the prescribed value, the switch 110 operates so that the driving ability of the output buffer becomes large according to the level of the control voltage signal Vt output from the voltage break circuit 30. It is therefore possible to prevent the occurrence of faulty operation and runaway of the microcomputer 391.

Figure 40:
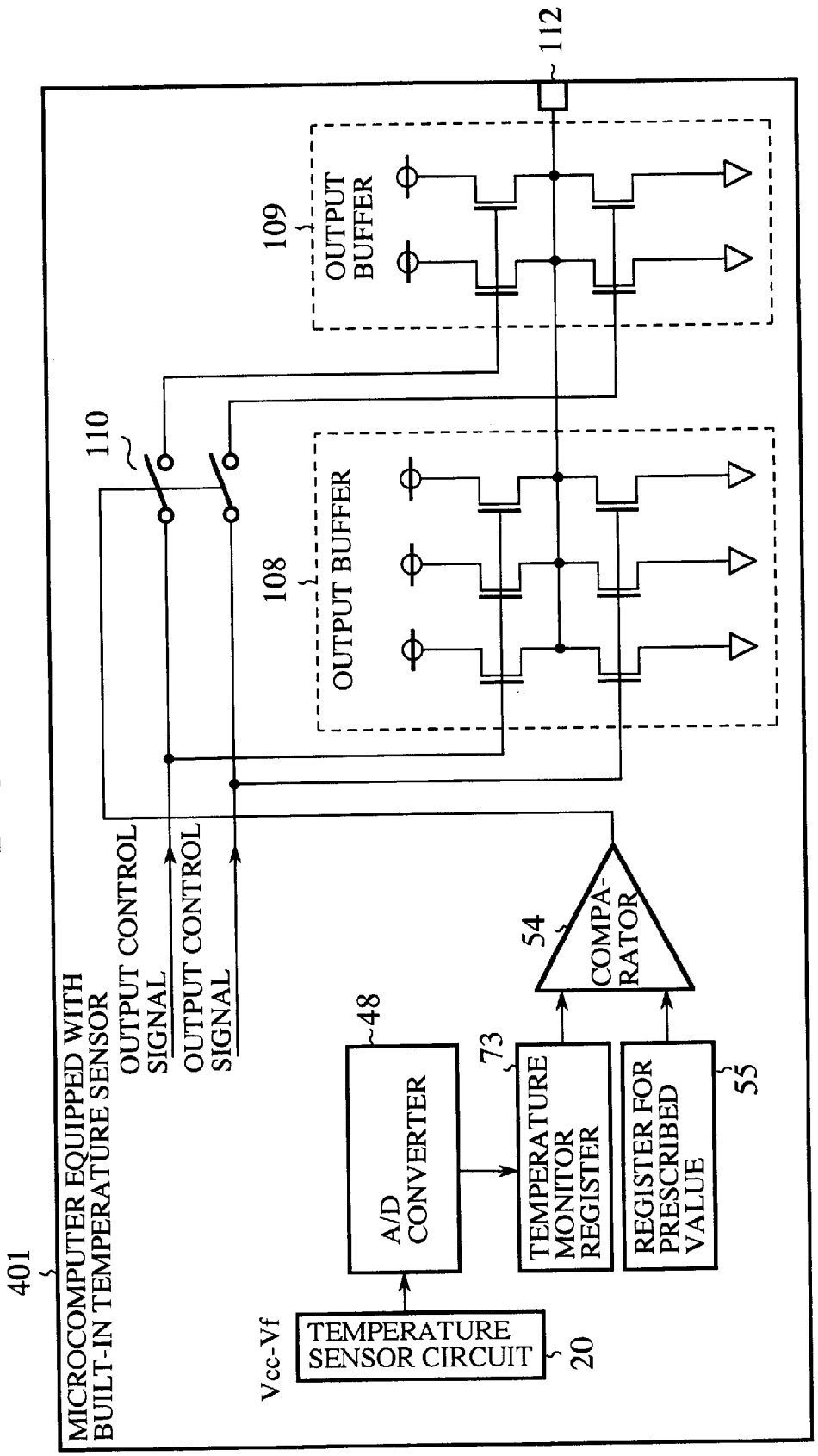
FIG. 40 is a block diagram showing another configuration of the microcomputer equipped with the built-in temperature sensor according to the ninth embodiment of the present invention.

FIG. 40 is a block diagram showing another configuration of the microcomputer 391 equipped with the built-in temperature sensor shown in FIG. 39. In FIG. 20, the reference number 20 designates a temperature sensor circuit, 48 denotes an A/D converter, 73 indicates a temperature monitor register, 55 designates a register for storing a prescribed value, and 54 denotes a comparator. The configuration and operation of them are the same as those shown in FIG. 19. The reference numbers 108 and 109 designate output buffers, 110 denotes a switch, and 112 indicates an output terminal. These operations of the circuit components 20, 48, 73, 54, and 55 are the same as the operation of these circuit components shown in FIG. 39. Therefore the explanation for them is omitted here. The reference number 401 designates the microcomputer 391 equipped with the built-in temperature sensor.

Thus, the switch 110 operates so that the driving ability of the total output buffers is changed according to the control signal output from the comparator 54. Even if the temperature of the semiconductor chip rises over the prescribed value, it is therefore possible to prevent the occurrence of faulty operation and runaway of the microcomputer 401.

As described above, according to the ninth embodiment, the switch changes the total driving ability of the output buffers according to the control voltage signal from the voltage break circuit or the comparison result obtained by comparing the digital voltage value from the A/D converter with the prescribed value. Therefore even if the temperature of the semiconductor chip rises over the prescribed value, the total driving ability of the output buffers can be increased, so that it is possible to prevent the occurrence of faulty operation and runaway of the microcomputer.

Tenth Embodiment

Figure 41:
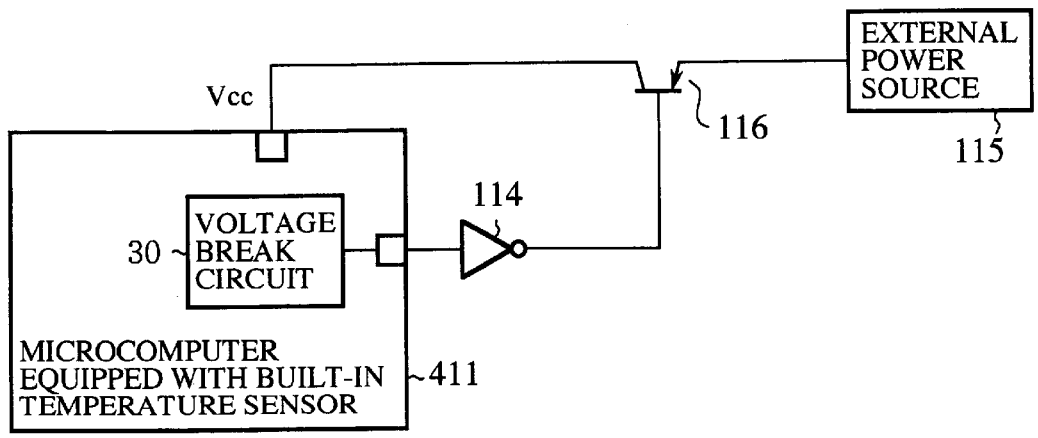
FIG. 41 is a block diagram showing a configuration of a microcomputer equipped with a built-in temperature sensor according to the tenth embodiment of the present invention.

FIG. 41 is a block diagram showing a configuration of a microcomputer equipped with a built-in temperature sensor according to the tenth embodiment of the present invention. In FIG. 41, the reference number 30 designates a voltage break circuit, which corresponds to the voltage break circuit 30 shown in FIG. 8. The reference number 411 designates the microcomputer equipped with the built-in temperature sensor, 114 denotes an inverter, 115 indicates an external power source, and 116 denotes a transistor switch. The base of the transistor switch 116 is connected to the inverter 114, the emitter and the collector of which are connected to the external power source and a power source terminal of the microcomputer 431, respectively.

Figure 42:
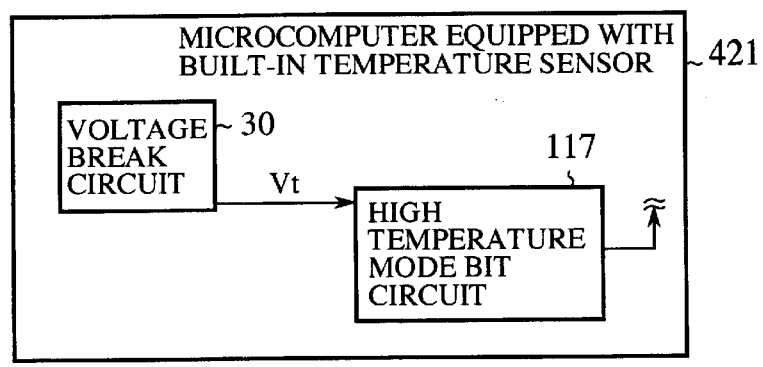
FIG. 42 is a block diagram showing another configuration of the microcomputer equipped with the built-in temperature sensor according to the tenth embodiment of the present invention.

FIG. 42 is a block diagram showing another configuration of the microcomputer 411 equipped with the built-in temperature sensor shown in FIG. 41. In FIG. 42, the reference number 117 designates a high temperature mode bit circuit, 30 denotes a voltage break circuit which corresponds to the voltage break circuit 30 shown in FIG. 8. The reference number 421 designates the microcomputer equipped with the built-in temperature sensor.

Next, a description will be given of the operation of the microcomputer according to the tenth embodiment.

When the temperature of the semiconductor chip on which the microcomputer equipped with the built-in temperature sensor is mounted rises over a predetermined value, similar to the case shown in FIG. 8, the temperature sensor 20 in the voltage break circuit 30 operates so that the voltage break circuit 30 outputs the control voltage signal Vt of the L level. The inverter 114 inverts the level of the control voltage signal Vt to the H level. When receiving the control voltage signal Vt of the H level, the transistor switch 116 becomes OFF. Accordingly, the supply of the power source voltage Vcc is thereby stopped, so that the operation of the microcomputer 411 halts. Thus, even if the temperature of the semiconductor chip rises over the prescribed value, it is possible to protect the semiconductor chip. After this, when the temperature of the semiconductor chip drops under the prescribed value, the voltage break circuit 30 outputs the control voltage signal Vt of the H level. The inverter 114 inverts the level of the control voltage signal Vt to the L level. When receiving the control voltage signal Vt of the L level, the transistor switch 116 becomes ON. Accordingly, the supply of the power source voltage Vcc to the microcomputer 411 is restarted, so that the operation of the microcomputer 411 starts again.

Next, in the configuration of the microcomputer equipped with the built-in temperature sensor shown in FIG. 42, when the temperature of the semiconductor chip rises over the prescribed value, similar to the case shown in FIG. 8, the temperature sensor 20 in the voltage break circuit 30 operates so that the voltage break circuit 30 outputs the control voltage signal Vt of the L level. When receiving the control voltage signal Vt, a high temperature mode bit circuit 117 switches the operation of the microcomputer 421 into a high temperature operation mode. In the high temperature operation mode, the operation frequency of the CPU and the A/D converter becomes low, or the power source voltage become high, or the switch to the transistors of a high driving ability is performed.

When the temperature of the semiconductor chip drops under the prescribed value, the temperature sensor 20 in the voltage break circuit 30 operates so that the voltage break circuit 30 outputs the control voltage signal Vt of the H level. When receiving the control voltage signal Vt, the high temperature mode bit circuit 117 switches the operation of the microcomputer 421 into a normal operation mode. Thus, even if the temperature of the semiconductor chip rises over the prescribed value, the high temperature mode bit circuit 117 can switch the operation mode of the microcomputer to the high temperature operation mode, it is thereby possible to prevent the occurrence of runaway of the microcomputer 421 and to protect the semiconductor chip.

Figure 43:
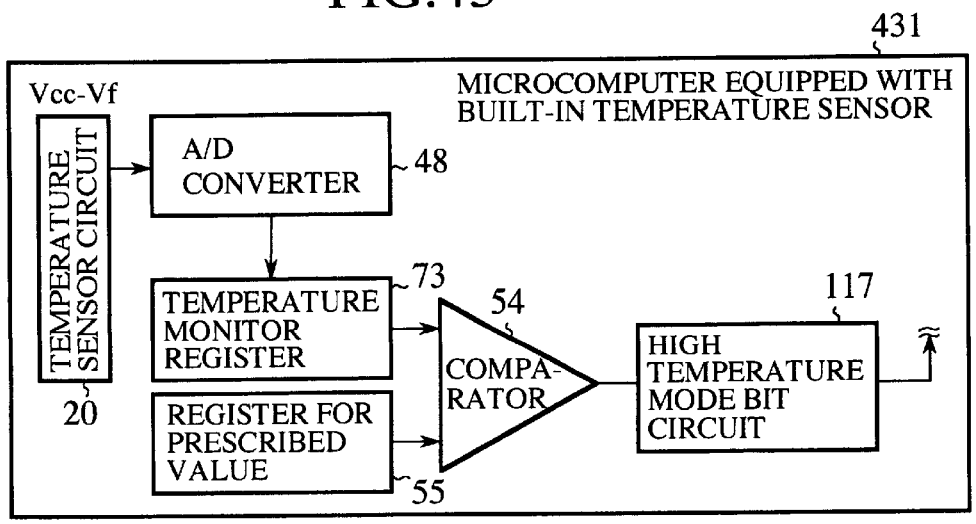
FIG. 43 is a block diagram showing another configuration of the microcomputer equipped with the built-in temperature sensor according to the tenth embodiment of the present invention.

FIG. 43 is a block diagram showing another configuration of the microcomputer 421 equipped with the built-in temperature sensor shown in FIG. 42. In FIG. 43, the reference number 20 designates a temperature sensor circuit, 48 denotes an A/D converter, 73 indicates a temperature monitor register, 55 indicates a register for storing a prescribed value, and 54 designates a comparator, whose configuration and operation are the same as those shown in FIG. 42. The explanation for the same circuit components is therefore omitted here. The reference number 431 designates the microcomputer equipped with the built-in temperature sensor.

In the microcomputer 431 equipped with the built-in temperature sensor shown in FIG. 43, when the temperature of the semiconductor chip rises over the prescribed value, the high temperature mode bit circuit 117 switches the operation mode of the microcomputer 431 to the high temperature operation mode according to the comparison result from the comparator 54. Similar to the example shown in FIG. 42, in the high temperature operation mode, the operation frequency of the CPU and the A/D converter becomes low, or the power source voltage become high , or the switch to the transistors of a high driving ability is performed.

On the other hand, when the temperature of the semiconductor chip drops under the prescribed value, the high temperature mode bit circuit 117 switches the operation mode of the microcomputer 431 to the normal operation mode according to the comparison result output from the comparator 54.

Thus, even if the temperature of the semiconductor chip rises over the prescribed value, the high temperature mode bit circuit 117 can switch the operation mode of the microcomputer 431 to the high temperature operation mode, it is thereby possible to prevent the occurrence of runaway of the microcomputer 431 and to protect the semiconductor chip.

As described above, according to the tenth embodiment, the high temperature mode bit circuit changes the operation mode of the microcomputer to the high temperature operation mode according to the control voltage signal from the voltage break circuit or the comparison result obtained by comparing the digital voltage value from the A/D converter with the prescribed value. Therefore even if the temperature of the semiconductor chip rises over the prescribed value, it is possible to prevent the occurrence of faulty operation and runaway of the microcomputer, and to protect the semiconductor chip.

As set forth in detail, according to the present invention, the microcomputer equipped with a built-in temperature sensor has a configuration in which a diode is incorporated in each circuit block, and a voltage generated at both ends of the diode is detected through terminals or pads. The microcomputer has a configuration in which the temperature of a pair of circuit blocks can be detected through terminals that are commonly used. The microcomputer has a configuration in which a selection switch selects a diode in one of a plurality of circuit blocks. Accordingly, it is possible to prevent the occurrence of faulty operation and runaway of the microcomputer, even if a temperature of the microcomputer rises over a prescribed value that has been predicted in design. Furthermore, because the terminals are commonly used for the plural circuit blocks so that the total number of terminals of the semiconductor chip on which the microcomputer is mounted is reduced, it is possible to design the microcomputer with an optimum operation margin.

Moreover, when the microcomputer has a configuration in which pads for supply of a constant current and for read of a voltage are incorporated, it is possible to further reduce the number of the terminals of the semiconductor chip, because it is not necessary to incorporate terminals to be used for measuring the temperature of the semiconductor chip.

In addition, according to the present invention, the microcomputer equipped with a built-in temperature sensor has a configuration in which a voltage break circuit comprising a temperature sensor circuit and an inverter circuit is incorporated, or a plurality of inverter circuit having different threshold values are incorporated. Accordingly, it is possible to detect the temperature of the semiconductor chip stepwise. Furthermore, because one of the plural inverter circuits having different threshold values is selected according to a value which is set in the selection register, it is possible to set an acceptable temperature range of the semiconductor chip for applications. Therefore, it is possible to design the microcomputer with an optimum operation margin that is capable of avoiding the occurrence of faulty operation and runaway, even if the temperature of the semiconductor chip becomes out of the acceptable temperature range.

Furthermore, according to the present invention, the microcomputer equipped with a built-in temperature sensor has a configuration in which the generation of a clock signal is controlled by a clock generation circuit based on an analogue voltage value which is output from a temperature sensor circuit, or a voltage break circuit. The microcomputer has a configuration in which the generation of a clock signal is controlled by the clock generation circuit based on a comparison result, obtained by comparing a digital voltage value which is converted from the analogue voltage value by an A/D converter, with a prescribed value stored in a register. It is therefore possible to provide a temperature monitor circuit, with a high degree of precision and with a high degree of flexibility in temperature setting. Accordingly, it is possible to prevent the occurrence of faulty operation and runaway of the microcomputer.

In addition, according to the present invention, the microcomputer equipped with a built-in temperature sensor has a configuration in which an interrupt circuit performs an interrupt processing based on an interrupt signal or a flag set signal as a control signal output from a temperature monitor circuit, a CPU core halts to generate a clock signal temporarily, and restarts the generation of the clock signal when a counting of a timer circuit reaches to a predetermined value. Thereby, it is possible to prevent the occurrence of faulty operation and runaway of the microcomputer, even if the temperature of the semiconductor chip rises over a predetermined value.

Furthermore, according to the present invention, the microcomputer equipped with a built-in temperature sensor has a configuration in which one of clock signals of a plurality of frequencies is selected based on a control voltage signal or a comparison result obtained by comparing a digital voltage value from an A/D converter with a prescribed value, and the selected clock signal is supplied to devices in the microcomputer. Accordingly, it is possible to prevent the occurrence of faulty operation and runaway of the microcomputer, even if the temperature of the semiconductor chip rises over a predetermined value.

In addition, according to the present invention, the microcomputer equipped with a built-in temperature sensor has a configuration in which: One of different voltages is selected based on a control voltage signal or a comparison result obtained by comparing a digital voltage value from an A/D converter with a prescribed value, and the selected voltage is supplied to devices in the microcomputer; Await control circuit selects one of clock signals of different frequencies and outputs the selected clock signal; A switch changes a total driving ability of the output buffer; and A high temperature mode bit circuit changes the operation of the microcomputer to a high temperature operation mode. Accordingly, it is possible to prevent the occurrence of faulty operation and runaway of the microcomputer, even if the temperature of the semiconductor chip rises over a predetermined value.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A microcomputer equipped with a built-in temperature sensor, comprising:
    diodes incorporated in a pair of circuit blocks, said diodes being placed in opposite polarity connection to each other;
    a first terminal group connected commonly to said each diode, through which a constant current is supplied; and
    a second terminal group through which a voltage generated at each diode is read, and connected commonly to and placed at more adjacent nodes to said each diode when compared with said first terminal group.

2. A microcomputer equipped with a built-in temperature sensor, comprising:
    a diode incorporated in each of a plurality of circuit blocks;
    a first terminal group connected commonly to said each of said plurality of diodes, through which a constant current is supplied;
    a second terminal group through which a voltage generated at each of said plurality of diodes is read, and connected commonly to and placed at more adjacent nodes to said each of said plurality of diodes when compared with said first terminal group;
    a selection switch for selecting one of said plurality of diodes; and
    a selection register in which a prescribed value to control operation of said selection switch is stored.

3. A microcomputer equipped with a built-in temperature sensor, comprising:
    a temperature sensor circuit comprising a diode and a first resistance connected in series between a first power source voltage and a second power voltage source;
    a MOS inverter circuit comprising:
        a first MOS transistor whose gate is connected to a node through which said diode and said first resistance being connected; and
        a second resistance connected to said first MOS transistor in series,
        wherein said second resistance is connected to said first power source voltage, and said first MOS transistor is connected to said second power source voltage, and
    a terminal connected to a second node through which said second resistance and said first MOS transistor being connected,
    wherein said temperature sensor circuit and said MOS inverter circuit forms a voltage break circuit.

4. A microcomputer equipped with a built-in temperature sensor according to claim 3, wherein a plurality of said MOS inverter circuits placed in parallel, each MOS inverter circuit comprises said first MOS transistor and said second resistance, and
threshold values of said first MOS transistors in said plurality of MOS inverter circuits are set stepwise, said gates of said first MOS transistors are commonly connected to said first node, and each of said second nodes of said plurality of MOS inverter circuits is connected to, instead of said terminal, a corresponding register in which a value corresponding to a voltage potential at each second node.

5. A microcomputer equipped with a built-in temperature sensor according to claim 4, further comprises:
    a selection switch selects one of said plurality of MOS inverter circuits in order to connect said selected MOS inverter to said temperature sensor circuit and said terminal through said first node and said second node; and
    a selection register stores a prescribed value by which an operation of said selection switch is controlled.

6. A microcomputer equipped with a built-in temperature sensor, comprising:
    a voltage break circuit comprising:
        a temperature sensor circuit placed in a circuit block comprising a diode and a first resistance connected in series to a first power source voltage and a second power source voltage;
        a first MOS transistor whose gate is connected to a first node through which said diode and said first resistance are connected; and
        a second resistance connected in series to said first MOS transistor,
        wherein said second resistance is connected to said first power source voltage, and said first MOS transistor is connected to said second power source voltage, and
    a power source voltage generation circuit in which a selector is incorporated, said selector inputs a control voltage signal output from said voltage break circuit, and selects one of a first voltage and a second voltage based on a level of said control voltage signal, and outputs said voltage.

7. A microcomputer equipped with a built-in temperature sensor according to claim 6, further comprises:
    a plurality of said MOS inverter circuits placed in parallel, each MOS inverter circuit comprises said first MOS transistor and said second resistance, threshold values of said first MOS transistors in said plurality of MOS inverter circuits are set stepwise;
    a selection switch for selecting one of said plurality of MOS inverter circuits, and for connecting said selected one to said temperature sensor circuit and said power source voltage generation circuit; and
    a selection register for storing a prescribed value by which operation of said selection switch is controlled.

8. A microcomputer equipped with a built-in temperature sensor, comprising:
    a temperature sensor circuit comprises a diode and a first resistance connected in series between a first power source voltage and a second power voltage source;
    an A/D converter for converting an analogue voltage value at a first node through which said diode and said first resistance to a digital voltage value;
    a temperature monitor register for storing said digital voltage value output from said A/D converter;

a prescribed value register for storing a prescribed value;

a comparator for comparing said digital voltage value in said temperature monitor register and said prescribed value stored in said prescribed value register, and for outputting a comparison result; and a power source voltage generation circuit in which a selector is incorporated, said selector for selecting one of a first voltage and a second voltage based on a level of said comparison result, and for outputting said selected voltage.

9. A microcomputer equipped with a built-in temperature sensor according to claim 8, further comprises:

a plurality of said prescribed value registers for storing a plurality of prescribed values; and a plurality of said comparators corresponding to said plurality of prescribed value registers, wherein each of said plurality of comparators inputs an output from said temperature monitor register and said prescribed value from said corresponding prescribed value register.

10. A microcomputer equipped with a built-in temperature sensor, comprising:

a voltage break circuit comprising:

a temperature sensor circuit incorporated in a circuit block comprising a diode and a first resistance connected in series to a first power source voltage and a second power source voltage;

a MOS transistor whose gate is connected to a first node through which said diode and said first resistance are connected; and a second resistance connected in series to said MOS transistor, wherein said second resistance is connected to said first power source voltage, and said MOS transistor is connected to said second power source voltage, and a wait control circuit in which a selector is incorporated, said selector inputs a control voltage signal output from said voltage break circuit, and selects one of a first clock signal of a first cycle and a second clock signal of a second cycle based on a level of said control voltage signal, and outputs said selected clock signal in order to adjust an accessing time by which an external device is accessed correctly.

11. A microcomputer equipped with a built-in temperature sensor according to claim 10, wherein a circuit is incorporated instead of said voltage break circuit, said circuit comprises:

a temperature sensor circuit comprises a diode and a first resistance connected in series between a first power source voltage and a second power voltage source;

an A/D converter for converting an analogue voltage value at a first node through which said diode and said first resistance to a digital voltage value;

a temperature monitor register for storing said digital voltage value output from said A/D converter;

a prescribed value register for storing a prescribed value; and a comparator for comparing said digital voltage value in said temperature monitor register and said prescribed value stored in said prescribed value register, and for outputting a comparison result, wherein said selector incorporated in said wait control circuit selects one of said first clock signal of a first bus cycle and said second clock signal of a second bus cycle based on said comparison result from said comparator.

12. A microcomputer equipped with a built-in temperature sensor according to claim 10, wherein a first output buffer, a second output buffer, and a switch are incorporated instead of said wait control circuit, wherein said switch inputs said control voltage signal output from said voltage break circuit, and selects one of or both said first output buffer and said second output buffer based on a level of said control voltage signal.

13. A microcomputer equipped with a built-in temperature sensor according to claim 10, wherein a high temperature mode bit circuit is incorporated instead of said wait control circuit, said high temperature mode bit circuit inputs said control voltage signal output from said voltage break circuit, and switches operation modes of said microcomputer, a high temperature operation mode and a normal operation mode, according to a level of said control voltage signal.

* * * * *